(12) United States Patent
Lin et al.

(10) Patent No.: US 12,014,982 B2
(45) Date of Patent: Jun. 18, 2024

(54) INTEGRATED CIRCUIT DEVICE AND METHOD

(71) Applicant: TAIWAN SEMICONDUCTOR MANUFACTURING COMPANY, LTD., Hsinchu (TW)

(72) Inventors: Cheng-Yu Lin, Hsinchu (TW); Jung-Chan Yang, Hsinchu (TW); Hui-Zhong Zhuang, Hsinchu (TW); Sheng-Hsiung Chen, Hsinchu (TW); Kuo-Nan Yang, Hsinchu (TW); Chih-Liang Chen, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 149 days.

(21) Appl. No.: 17/463,203

(22) Filed: Aug. 31, 2021

(65) Prior Publication Data
US 2023/0068280 A1    Mar. 2, 2023

(51) Int. Cl.
*G06F 30/30*    (2020.01)
*G06F 30/347*    (2020.01)
(Continued)

(52) U.S. Cl.
CPC .......... *H01L 23/528* (2013.01); *G06F 30/347* (2020.01); *G06F 30/392* (2020.01); *G06F 30/394* (2020.01); *H01L 23/50* (2013.01); *H01L 27/07* (2013.01); *H01L 27/11807* (2013.01); *H01L 29/41733* (2013.01);
(Continued)

(58) Field of Classification Search
CPC ....... H01L 23/528; H01L 23/50; H01L 27/07; H01L 27/0207; H01L 27/0203; H01L 2027/11881; H01L 2027/11887; H01L 21/76897; H01L 27/11807; H01L 29/41733; H01L 2027/11879; H01L 23/5286; H01L 2027/11874; H01L 23/5386; G06F 30/347; G06F 30/392; G06F 30/394; H10B 61/00; H10B 63/80
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |

(Continued)

*Primary Examiner* — Jack Chiang
*Assistant Examiner* — Brandon Bowers
(74) *Attorney, Agent, or Firm* — Hauptman Ham, LLP

(57) ABSTRACT

An IC device includes first and second cells adjacent each other and over a substrate. The first cell includes a first IO pattern along a first track among a plurality of tracks in a first metal layer, the plurality of tracks elongated along a first axis and spaced from each other along a second axis. The second cell includes a plurality of conductive patterns along corresponding different tracks among the plurality of tracks in the first metal layer, each of the plurality of conductive patterns being an IO pattern of the second cell or a floating conductive pattern. The first metal layer further includes a first connecting pattern along the first track and connects the first IO pattern and a second IO pattern of the second cell. The second IO pattern is one of the plurality of conductive patterns of the second cell and is along the first track.

20 Claims, 25 Drawing Sheets

(51) Int. Cl.
*G06F 30/392* (2020.01)
*G06F 30/394* (2020.01)
*H01L 23/50* (2006.01)
*H01L 23/528* (2006.01)
*H01L 27/07* (2006.01)
*H01L 27/118* (2006.01)
*H01L 29/417* (2006.01)
*H01L 27/02* (2006.01)

(52) U.S. Cl.
CPC .. *H01L 27/0207* (2013.01); *H01L 2027/11879* (2013.01); *H01L 2027/11881* (2013.01); *H01L 2027/11887* (2013.01)

(56) References Cited

U.S. PATENT DOCUMENTS

| | | | |
|---|---|---|---|
| 10,297,588 B2* | 5/2019 | Lin | H01L 21/823475 |
| 11,676,957 B2* | 6/2023 | Chen | H01L 23/528 |
| | | | 257/288 |
| 2014/0040838 A1 | 2/2014 | Liu et al. | |
| 2015/0278429 A1 | 10/2015 | Chang | |
| 2020/0105752 A1* | 4/2020 | Liaw | H01L 21/823412 |
| 2022/0253283 A1* | 8/2022 | Seo | H03K 17/6872 |
| 2022/0359027 A1* | 11/2022 | Chang | H10B 20/20 |
| 2023/0067734 A1* | 3/2023 | Chang | G06F 30/394 |
| 2023/0068280 A1* | 3/2023 | Lin | H01L 23/50 |

* cited by examiner

INTEGRATED CIRCUIT DEVICE AND METHOD

BACKGROUND

An integrated circuit (IC) device includes one or more semiconductor devices represented in an IC layout diagram (also referred to as a "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization. Routing and placing is where the different semiconductor devices in an IC device are connected. One of the goals of routing and placing in a layout is to reduce the amount of and/or resources for routing required and thereby improve power and/or space consumed by a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5F-5I each include a schematic view of a layout diagram of a cell, and various layout diagrams of one or more IC devices including the cell, in accordance with some embodiments.

DETAILED DESCRIPTION

Figure 1B:
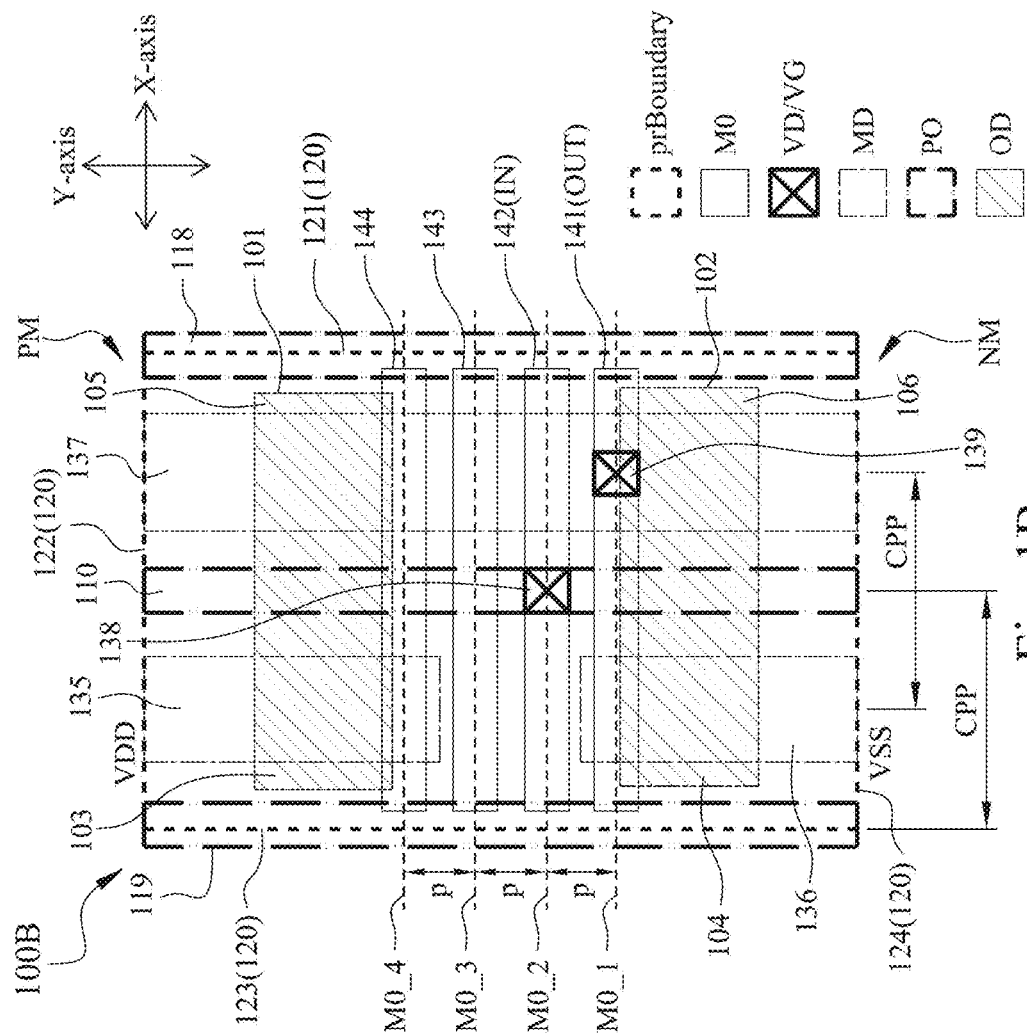
FIGS. 1B-1G are schematic views of layout diagrams of various cells, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cell has at least one active region and at least one gate region electrically coupled to form internal circuitry of a cell. In a metal layer, the cell includes one or more input/output (TO) pins (also referred to as "IO patterns") configured to electrically couple the internal circuitry inside the cell to external circuitry outside the cell. In an IC device in accordance with some embodiments, a first cell is placed adjacent a second cell so that a first IO pattern of the first cell is aligned with a second IO pattern of the second cell in the same metal layer. As a result, it is possible in one or more embodiments to perform routing between the first cell and the second cell simply by generating, in the same metal layer, a connecting pattern aligned with and contiguous to the first IO pattern and the second IO pattern. In a first aspect, one or more embodiments implement this arrangement by restricting IO patterns to a certain track in a metal layer containing IO patterns. In a second aspect, one or more embodiments implement this arrangement by providing several versions of the same cell with corresponding IO patterns in different tracks in a metal layer containing IO patterns. In a third aspect, one or more embodiments implement this arrangement by a cell having multiple IO patterns and/or floating conductive patterns configurable as IO patterns in different tracks in a metal layer containing IO patterns. Some embodiments include features of more than one, or all, of the described aspects. In at least one embodiment, it is possible to save the chip area and/or routing resources, especially where the metal layer containing the IO patterns includes the metal-zero (M0) layer and/or the back-side-metal-zero (BM0 or M0_B) layer.

Figure 1A:
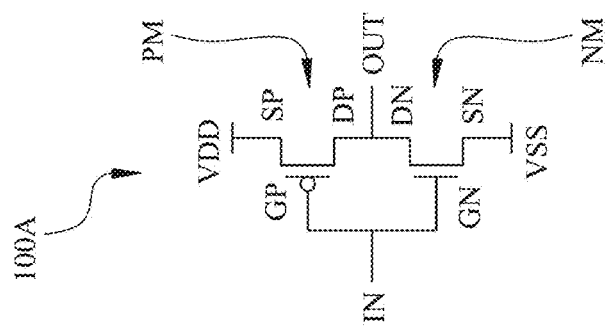
FIG. 1A is a circuit diagram of a cell, in accordance with some embodiments.

FIG. 1A is a circuit diagram of a cell 100A, in accordance with some embodiments. In FIG. 1A, the cell 100A is an inverter. This is an example, and other cells are within the scope of various embodiments. For example, in various embodiments, the cell 100A is a function cell, an engineering change order (ECO) cell, a physical cell, a filler cell, or another type of cell or combination of cells capable of being defined in an IC layout diagram.

A function cell is a cell pre-designed to provide a specific function to an IC incorporating such a function cell. Examples of function cells include, but are not limited to, a logic gate cell, a memory cell, or the like. Examples of logic gate cells include, but are not limited to, AND, OR, NAND, NOR, XOR, INV, AND-OR-Invert (AOI), OR-AND-Invert (OAI), MUX, Flip-flop, BUFF, Latch, delay, clock, or the like. Examples of memory cells include, but are not limited to, a static random access memory (SRAM), a dynamic RAM (DRAM), a resistive RAM (RRAM), a magnetoresistive RAM (MRAM), a read only memory (ROM) cell, or another type of cell capable of having multiple states representative of logical values.

An ECO cell is a cell pre-designed without a specific function, but is programmable to provide an intended function. For example, to design an IC, the pre-designed layouts of one or more function cells are read out from a standard cell library and placed into an initial IC layout. The IC layout also includes one or more ECO cells which are not yet connected or routed to the function cells. When the IC layout is to be revised, one or more of the already placed ECO cells are programed to provide an intended function and routed to the function cells. The programing of ECO cells involves modifications in one or more layers of the IC layout and/or masks for manufacturing the IC.

A physical cell is a cell configured to provide a function, other than a logic function, to an IC incorporating such physical cell. Examples of physical cells include, but are not limited to, a TAP cell, a DCAP cell, or the like. A TAP cell defines a region in a doped well where the doped well is coupled to a bias voltage, such as a power supply voltage. TAP cells are included in an IC layout diagram, e.g., to improve latch-up immunity of ICs manufactured in accordance with the IC layout diagram. A DCAP cell includes one or more decoupling capacitors (decap) between power buses or rails, e.g., as a charge reservoir to provide additional power in situations where there is a high demand for current from the power supply.

A purpose of filler cells is to fill an empty space in an IC layout diagram, for example, to satisfy one or more design rules, such as a minimum spacing between adjacent features. In some embodiments, a physical cell is placed as a filler cell. In at least one embodiment, a filler cell is a cell with no logical functionality that is not connected or routed to other cells in an IC layout diagram. Cells other than filler cells are referred to herein as "non-filler cells."

In the example circuit diagram in FIG. 1A, the inverter in the cell 100A comprises a p-channel metal-oxide semiconductor (PMOS) transistor PM and an n-channel metal-oxide semiconductor (NMOS) transistor NM coupled in series between a first power supply voltage VDD and a second power supply voltage VSS. Specifically, the transistor PM comprises a gate region GP, a source region SP, and a drain region DP. The transistor NM comprises a gate region GN, a source region SN, and a drain region DN. The gate regions GP, GN are coupled to an input node IN. The drain regions DP, DN are coupled to an output node OUT. The source region SP is coupled to VDD, and the source region SN is coupled to VSS. In at least one embodiment, VDD is a positive power supply voltage, and VSS is a ground voltage. The inverter is configured to invert a signal at the input node IN and to output the inverted signal at the output node OUT. Other types of transistors are within the scopes of various embodiments, as described herein.

FIG. 1B is a schematic view of a layout diagram of a cell 100B, in accordance with some embodiments. In at least one embodiment, the layout diagram of the cell 100B in FIG. 1B is stored as a standard cell in a standard cell library on a non-transitory computer-readable medium. The cell 100B is an inverter corresponding to the cell 100A. In the example configuration in FIG. 1B, the cell 100B is an inverter with a driving strength of 1. Other example inverter cells with other driving strengths, e.g., 2, 4, 6, or the like, are within the scopes of various embodiments.

In FIG. 1B, the cell 100B comprises at least one active region, at least one gate region extending across the at least one active region, and a boundary in which the at least one active region and the at least one gate region are arranged. For example, the cell 100B comprises active regions 101, 102, a gate region 110, and a boundary 120.

The active regions 101, 102 are arranged inside the boundary 120, and extend along a first axis, i.e., X-axis. Active regions are sometimes referred to as oxide-definition (OD) regions, and are schematically illustrated in the drawings with the label "OD." In an IC device comprising the cell 100B in accordance with at least one embodiment, the active regions 101, 102 are over a first side, or a front side, of a substrate as described herein. The active regions 101, 102 include P-type dopants and/or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-channel and/or N-channel field effect transistors (PFETs/NFETs), etc.), FinFETs, planar MOS transistors with raised source/drains, nanosheet FETs, nanowire FETs, or the like. An active region configured to form one or more PMOS devices therein is referred to herein as a "PMOS active region." An active region configured to form one or more NMOS devices therein is referred to herein as an "NMOS active region." In embodiments described herein, a PMOS active region is replaceable with an NMOS active region, and vice versa.

The gate region 110 is arranged inside the boundary 120, and extends across the active regions 101, 102 along a second axis, i.e., Y-axis, which is transverse to the X-axis. In at least one embodiment, the Y-axis is perpendicular to the X-axis. The gate region 110 includes a conductive material, such as, polysilicon, and is schematically illustrated in the drawings with the label "PO." Other conductive materials for the gate region, such as metals, are within the scope of various embodiments.

In the example configuration in FIG. 1B, the active region 101 is a PMOS active region configured to form, together with the gate region 110, the transistor PM of the inverter as described with respect to FIG. 1A. The active region 102 is an NMOS active region configured to form, together with the gate region 110, the transistor NM of the inverter as described with respect to FIG. 1A. Specifically, the active region 101 comprises a source region 103 and a drain region 105 on opposite sides of a first section of the gate region 110 which extends over the active region 101. The source region 103, the drain region 105 and the first section of the gate region 110 correspond to the source region SP, the drain region DP, and the gate region GP described with respect to FIG. 1A. The active region 102 comprises a source region 104 and a drain region 106 on opposite sides of a second section of the gate region 110 which extends over the active region 102. The source region 104, the drain region 106 and the second section of the gate region 110 correspond to the source region SN, the drain region DN, and the gate region GN described with respect to FIG. 1A.

The boundary 120 comprises edges 121, 122, 123, 124 connected together to form a closed boundary. In a place-and-route operation (also referred to as "automated placement and routing (APR)") described herein, cells are placed in an IC layout diagram in abutment with each other at their respective boundaries. For example, the cell 100B is placed in abutment with one or more other cells along the X-axis at one or more of the edges 121, 123. Additionally or alternatively, the cell 100B is placed in abutment with one or more other cells along the Y-axis at one or more of the edges 122, 124. The boundary 120 is sometimes referred to as "place-and-route boundary" and is schematically illustrated in the drawings with the label "prBoundary." In the example configuration in FIG. 1B, the boundary 120 has a rectangular shape, with the edges 121, 123 parallel to the Y-axis, and the edges 122, 124 parallel to the X-axis. Other configurations are within the scopes of various embodiments. For example, in one or more embodiments, the boundary 120 has a shape other than a rectangle shape and/or one or more edges of the boundary 120 are oblique with respect to the X-axis and the Y-axis.

The cell 100B further comprises dummy gate regions 118, 119 along the corresponding edges 121, 123 of the boundary 120. In at least one embodiment, centerlines of the dummy gate regions 118, 119 coincide with the corresponding edges 121, 123 of the boundary 120. The gate region 110 is an example of "functional gate regions" which, together with the underlying active regions, configure transistors and/or are electrically coupled to one or more other circuit elements. Unlike functional gate regions, dummy gate regions, or non-functional gate regions, are not configured to form transistors together with underlying active regions, and/or one or more transistors formed by dummy gate regions together with the underlying active regions are not electrically coupled to other circuit elements. In at least one embodiment, dummy gate regions include dielectric material in a manufactured IC device. In some embodiments, dummy gate regions and functional gate regions are arranged at the same pitch CPP, i.e., a center-to-center distance, along the X-axis. In a place-and-route operation when the cell 100B is placed to abut other cells, the dummy gate regions 118, 119 along the edges 121, 123 of the boundary 120 are merged with corresponding dummy gate regions of the other cells. Other configurations are within the scopes of various embodiments. For example, in one or more embodiments, one or more of the edges 121, 123 of the boundary 120 are not arranged along the dummy gate regions 118, 119.

The described configuration of the cell 100B comprising two active regions 101, 102 directly adjacent each other along the Y-axis is an example. Other cells in various embodiments include other numbers of active regions arranged along the Y-axis. Two active regions are directly adjacent along the Y-axis when there are no other active regions therebetween. In the example configuration in FIG. 1B, each of the active regions 101, 102 has, along the X-axis, opposite edges (not numbered) inwardly spaced from the corresponding edges 121, 123 of the boundary 120. Other configurations are within the scope of various embodiments. For example, in one or more embodiments, the active regions 101, 102 have, along the X-axis, the opposite edges coinciding with the corresponding edges 121, 123 of the boundary 120. The cell 100B comprises a functional gate region 110. This is an example, and other cells in various embodiments include multiple functional gate regions.

The cell 100B further comprises contact structures over and in electrical contact with the corresponding source/drain regions in the active regions 101, 102. Contact structures are sometimes referred to as metal-to-device structures, and are schematically illustrated in the drawings with the label "MD." An MD contact structure includes a conductive material formed over a corresponding source/drain region in the corresponding active region to define an electrical connection from one or more devices formed in the active region to other circuitry. In the example configuration in FIG. 1B, MD contact structures 135, 136 are over and in electrical contact with the corresponding source regions 103, 104, and an MD contact structure 137 extends continuously along the Y-axis to be over and in electrical contact with both corresponding drain regions 105, 106. The MD contact structure 137 electrically couples the drain regions 105, 106 together. The MD contact structure 137 is an example of an extended contact structure that extends over multiple active regions. In some embodiments, an extended contact structure is in electrical contact with all the underlying active regions. In one or more embodiments, an extended contact structure is in electrical contact with at least one of the underlying active regions, while flying over without electrical contact with the other underlying active region(s). In some embodiments, MD contact structures and gate regions (including both functional and dummy gate regions) are arranged alternatingly along the X-axis. A pitch, i.e., a center-to-center distance along the X-axis, between directly adjacent MD contact structures is the same as the pitch CPP between directly adjacent gate regions. Two gate regions (including functional and/or dummy gate regions) are considered directly adjacent along the X-axis where there are no other gate regions (including functional and/or dummy gate regions) therebetween. Two MD conductive patterns are considered directly adjacent along the X-axis where there are no other MD conductive patterns therebetween. An example conductive material of MD contact structures includes metal. Other configurations are within the scopes of various embodiments.

The cell 100B further comprises vias over and in electrical contact with the corresponding gate regions or MD contact structures. A via over and in electrical contact with an MD contact structure is sometimes referred to as via-to-device (VD). A via over and in electrical contact with a gate region is sometimes referred to as via-to-gate (VG). VD and VG vias are schematically illustrated in the drawings with the label "VD/VG." In the example configuration in FIG. 1B, a VG via 138 is over and in electrical contact with the gate region 110, and a VD via 139 is over and in electrical contact with the MD contact structure 137. An example material of the VD and VG vias includes metal. Other configurations are within the scopes of various embodiments.

The cell 100B further comprises one or more metal layers and via layers sequentially and alternatingly arranged over the VD and VG vias. The lowermost metal layer immediately over and in electrical contact with the VD and VG vias is a metal-zero (M0) layer. In other words, the M0 layer is the lowermost metal layer over, or the closest metal layer to, the active regions 101, 102 on the front side of the substrate. A next metal layer immediately over the M0 layer is a metal-one (M1) layer, or the like. A via layer Vn is arranged between and electrically couple the Mn layer and the Mn+1 layer, where n is an integer form zero and up. For example, a via-zero (V0) layer is the lowermost via layer which is arranged between and electrically couple the M0 layer and the M1 layer. Other via layers are V1, V2, or the like. Metal layers, such as M0, M1, or the like, and via layers, such as V0, V1, or the like, on the front side of the substrate are referred to herein as front side metal layers and front side via layers.

In the example configuration in FIG. 1B, the cell 100B comprises, in the M0 layer, M0 conductive patterns 141, 142, 143, 144 along corresponding tracks M0_1, M0_2, M0_3, M0_4. The tracks M0_1, M0_2, M0_3, M0_4 or the like are also referred to herein as M0 tracks. The tracks M0_1, M0_2, M0_3, M0_4 and the corresponding M0 conductive patterns 141, 142, 143, 144 extend along the X-axis and are spaced from each other along the Y-axis. In the example configuration in FIG. 1B, the tracks M0_1, M0_2, M0_3, M0_4 are spaced from each other along the Y-axis by a pitch p, and coincide with center lines of the corresponding M0 conductive patterns 141, 142, 143, 144. The tracks M0_1, M0_2, M0_3, M0_4 define locations where M0 conductive patterns are formed in the M0 layer to ensure that predetermined design rules are satisfied. In at least one embodiment, all M0 conductive patterns extend or are elongated along the same direction, e.g., along the X-axis, and are not elongated along the Y-axis. In some embodiments, the conductive patterns in the M0 layer belong to the same mask. In at least one embodiment, the conductive patterns in the M0 layer are separated into several masks to meet one or more design and/or manufacturing requirements. For example, the M0 conductive patterns 141, 143 belong to one mask, and the M0 conductive patterns 142, 144 belong to another mask. The number of four tracks of M0 conductive patterns over the cell 100B is an example. Other numbers of tracks of M0 conductive patterns over a cell are within the scopes of various embodiments.

The M0 conductive patterns 141, 142, 143, 144 are configured to electrically couple various devices in the cell 100B into internal circuitry of the cell 100B, and/or to electrically couple the internal circuitry of the cell 100B with circuitry external of the cell 100B, e.g., to other cells of an IC device including the cell 100B. For example, the M0 conductive pattern 141 overlaps and is electrically coupled to the VD via 139, and the M0 conductive pattern 142 overlaps and is electrically coupled to the VG via 138. As a result, the M0 conductive pattern 141 is electrically coupled to the drain regions 105, 106 through the MD contact structure 137 and the VD via 139, and the M0 conductive pattern 142 is electrically coupled to the gate region 110 through the VG via 138. The M0 conductive pattern 141 corresponds to the output node OUT in FIGS. 1A and 1s an IO pattern, e.g., an output pattern, of the cell 100B. The M0 conductive pattern 142 corresponds to the input node IN in FIGS. 1A and 1s another IO pattern, e.g., an input pattern, of the cell 100B. The M0 conductive patterns 143, 144 are floating M0 conductive patterns. In some embodiments, at least one of the M0 conductive patterns 143, 144 is omitted. In some embodiments, at least one of the M0 conductive patterns 143, 144 is electrically coupled to the M0 conductive pattern 141 or the M0 conductive pattern 142 to be configured as another output pattern or input pattern of the cell 100B for routing to another cell, as described herein.

In the example configuration in FIG. 1B, each of the M0 conductive patterns 141, 142, 143, 144 extends up to, but remains inwardly spaced from the edges 121, 123 of the boundary 120. In other words, the M0 conductive patterns 141, 142, 143, 144 are completely arranged inside the boundary 120. For example, right edges (not numbered) of the M0 conductive patterns 141, 142, 143, 144 are adjacent, but inwardly spaced from the edge 121 of the boundary 120, whereas left edges (not numbered) of the M0 conductive patterns 141, 142, 143, 144 are adjacent, but inwardly spaced from the edge 123 of the boundary 120. This arrangement makes it possible for the input pattern(s) and/or output pattern(s) of the cell 100B to be accessible for routing in the M0 layer to other cells from both the right side and the left side of the cell 100B. However, other configurations are within the scopes of various embodiments.

For example, in some embodiments, the M0 conductive pattern 141 is divided into several sections (not shown) spaced, and electrically isolated, from each other along the X-axis. As a result, the rightmost section of the M0 conductive pattern 141 is an output pattern of the cell 100B, but the other section(s) of the M0 conductive pattern 141 is/are not configured as an output pattern of the cell 100B. In other words, the output pattern of the cell 100B is accessible for routing in the M0 layer to another cell on the right side, but is not accessible for routing in the M0 layer to another cell on the left side of the cell 100B. In at least one embodiment, the output pattern of the cell 100B is accessible for routing in the M0 layer to another cell from the left side, but not from the right side.

For another example, in some embodiments, the M0 conductive pattern 142 is divided into several sections (not shown) spaced, and electrically isolated, from each other along the X-axis. As a result, the leftmost section of the M0 conductive pattern 142 is an input pattern of the cell 100B, but the other section(s) of the M0 conductive pattern 142 is/are not configured as an input pattern of the cell 100B. In other words, the input pattern of the cell 100B is accessible for routing in the M0 layer to another cell on the left side, but is not accessible for routing in the M0 layer to another cell on the right side of the cell 100B. In at least one embodiment, the input pattern of the cell 100B is accessible for routing in the M0 layer to another cell from the right side, but not from the left side.

In some embodiments, the output pattern and input pattern of the cell 100B are arranged along the same track. For example, one of the M0 conductive patterns 141, 142, 143, 144 is divided into left and right sections (not shown) spaced, and electrically isolated, from each other along the X-axis. The left section is electrically coupled to the gate region 110 by a corresponding VG via, and is configured as an input pattern, whereas the right section is electrically coupled to the MD contact structure 137 by a corresponding VD via, and is configured as an output pattern.

In some embodiments, the M0 layer further comprises, over the cell 100B, additional M0 conductive patterns (not shown) configured as a VDD power rail and a VSS power rail to provide VDD and VSS to the cell 100B on the front side of the substrate. In such embodiments, the MD conductive patterns 135, 136 are electrically coupled through corresponding VD vias (not shown) to the overlaying VDD power rail and VSS power rail in the M0 layer. As a result, the source regions 103, 104 of the corresponding transistors PM, NM are configured to correspondingly receive VDD and VSS as described with respect to FIG. 1A.

In some embodiments, VDD and VSS are instead provided to the cell 100B from the back side of the substrate. In such embodiments, the MD conductive patterns 135, 136 are not electrically coupled to the M0 layer or another metal layer above the M0 layer, and are provided to satisfy one or more design rules. For example, VDD and VSS power rails (not shown) are arranged on a second side, or a back side, of the substrate, and are electrically coupled correspondingly to the source regions 103, 104 through back side vias (not shown), as described with respect to FIG. 2.

FIGS. 1C-1G are schematic views of layout diagrams of various cells 100C-100G, in accordance with some embodiments. In at least one embodiment, one or more of the layout diagrams of the cells 100C-100G are stored as standard cells in one or more standard cell libraries on one or more non-transitory computer-readable media. Each of the cells 100C-100G is an inverter corresponding to the cell 100A and is the same as the cell 100B, except for configurations of the corresponding input patterns and/or output patterns. For simplicity, boundaries of the cells 100C-100G are omitted in FIGS. 1C-1G. Components in each of FIGS. 1C-1G having corresponding components in FIG. 1B are designated by the same reference numerals of FIG. 1B.

In FIGS. 1C-1F, the cells 100C-100F are examples of a plurality of cells having the same circuitry (e.g., inverter), but with corresponding IO patterns along different tracks in a metal layer. For example, the output pattern of the cell 100C is configured by the M0 conductive pattern 141 along the track M0_1, the output pattern of the cell 100D is configured by the M0 conductive pattern 142 along the track M0_2, the output pattern of the cell 100E is configured by the M0 conductive pattern 143 along the track M0_3, and the output pattern of the cell 100F is configured by the M0 conductive pattern 144 along the track M0_4. In other words, the cells 100C-100G are different versions of the inverter cell 100A, with corresponding output patterns along different M0 tracks. In some embodiments, different versions (not shown) of the inverter cell 100A, with corresponding input patterns along different M0 tracks are provided. In at least one embodiment, by providing multiple versions of a cell with corresponding TO patterns along different tracks in a metal layer, it is possible to select a version with the corresponding TO pattern along a desired track for placement and routing to another cell, as described with respect to one or more of FIGS. 4A-4G.

Figures 1C, 1D, 1E, 1F, 1G:
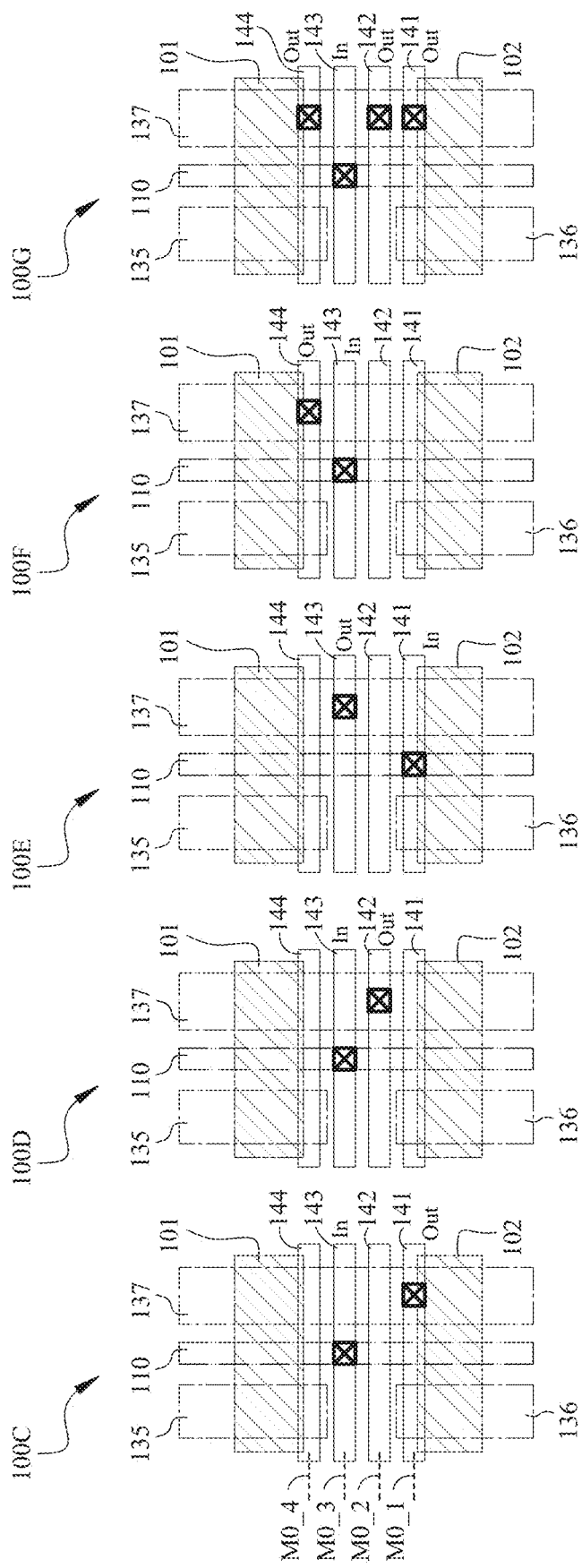

In FIG. 1G, the cell 100G is an example of a cell having a plurality of IO patterns electrically coupled with each other and arranged along corresponding different tracks in a metal layer. In the example configuration in FIG. 1G, the cell 100G has multiple output patterns configured by the M0 conductive patterns 141, 142, 144 along the tracks M0_1, M0_2, M0_4. The M0 conductive patterns 141, 142, 144 are electrically coupled with each other by the MD contact structure 137. In some embodiments, the cell 100G has output patterns along all tracks M0_1, M0_2, M0_3, M0_4, e.g., by dividing the M0 conductive pattern 143 into two sections correspondingly configured as an input pattern and an output pattern as described herein. In some embodiments, the cell 100G has input patterns electrically coupled with each other, e.g., through the gate region 110 and corresponding VG vias, and arranged along corresponding different tracks among the tracks M0_1, M0_2, M0_3, M0_4. In at least one embodiment, by providing a cell with multiple output patterns and/or multiple input patterns along different tracks in a metal layer, it is possible to select an output pattern or an input pattern along a desired track for placement and routing to another cell, as described with respect to one or more of FIGS. 5A-5I.

Figure 2:
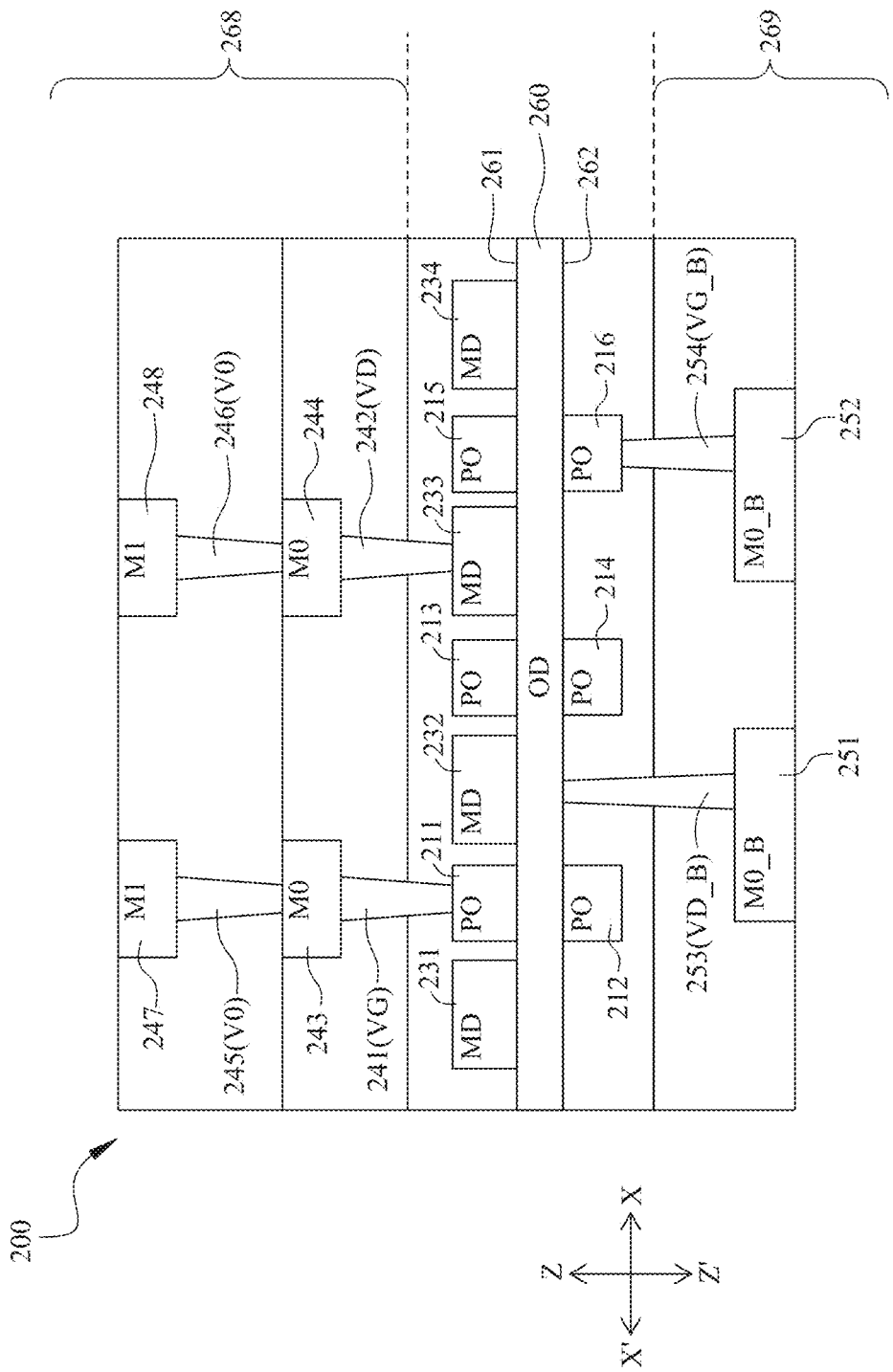
FIG. 2 is a schematic cross-sectional view of a circuit region of an IC device, in accordance with some embodiments.

FIG. 2 is a schematic cross-sectional view of a circuit region of an IC device 200, in accordance with some embodiments. The IC device 200 comprises one or more cells placed and routed as described herein.

As shown in FIG. 2, the IC device 200 comprises a substrate 260 over which circuit elements and structures corresponding to one or more cells described herein are formed. The substrate 260 has a first side 261 and a second side 262 opposite one another along a thickness direction of the substrate 260, i.e., along a Z-axis. In at least one embodiment, the first side 261 is referred to as "upper side" or "front side" or "device side," whereas the second side 262 is referred to as "lower side" or "back side." The substrate 260 comprises, in at least one embodiment, silicon, silicon germanium (SiGe), gallium arsenic, or other suitable semiconductor or dielectric materials.

The IC device 200 further comprises N-type and P-type dopants added to the substrate 260 to correspondingly form NMOS active regions and PMOS active regions. The NMOS active regions and PMOS active regions form corresponding active regions, and are collectively and schematically designated in FIG. 2 with the label "OD." In some embodiments, isolation structures are formed between adjacent active regions. For simplicity, isolation structures are omitted from FIG. 2. In at least one embodiment, the active regions in FIG. 2 correspond to one or more of the active regions 101, 102 described with respect to FIG. 1B.

The IC device 200 further comprises various gate structures over the active regions on both the front side 261 and the back side 262. For example, a gate structure comprises a gate portion 211 on the front side 261, and a gate portion 212 integral with the gate portion 211 and on the back side 262. A further gate structure comprises a gate portion 213 on the front side 261, and a gate portion 214 integral with the gate portion 213 and on the back side 262. Another gate structure comprises a gate portion 215 on the front side 261, and a gate portion 216 integral with the gate portion 215 and on the back side 262. The described configuration is referred to as "gate-all-around." Other configurations are within the scopes of various embodiments. For example, in at least one embodiment, gate structures are formed over the active regions on the front side 261, but not on the back side 262. One or more gate dielectric layers (not shown) are between the active regions and each gate structure. Example materials of the gate dielectric layer or layers include HfO2, ZrO2, or the like. Example materials of the gate structures include polysilicon, metal, or the like. In some embodiments, the gate structure 211, 212 corresponds to the functional gate region 110 and/or the gate structure 213, 214 corresponds to the dummy gate region 118, 119, as described with respect to FIG. 1B. In at least one embodiment, gate structures corresponding to dummy gate regions include dielectric materials.

The IC device 200 further comprises MD contact structures for electrically coupling source/drains of various transistors in the active regions to other circuit elements. For example, MD contact structures 231-234 are illustrated in FIG. 2. In some embodiments, at least one of the MD contact structures 231-234 corresponds to one of the MD contact structures 135-137, as described with respect to FIG. 1B.

The IC device 200 further comprises VD vias and VG vias correspondingly over and in electrical contact with MD contact structures and gate structures. For example, as shown in FIG. 2, a VG via 241 is over and in electrical contact with the gate portion 211 of the corresponding gate structure, and a VD via 242 is over and in electrical contact with the MD contact structure 233. In some embodiments, the VG via 241 corresponds to the VG via 138, and/or the VD via 242 corresponds to the VD via 139, as described with respect to FIG. 1B.

The IC device 200 further comprises, on the front side 261, an interconnect structure 268 which is over the VD and VG vias, and comprises a plurality of metal layers M0, M1, . . . and a plurality of via layers V0, V1, . . . arranged alternatingly in the thickness direction of the substrate 260, i.e., along the Z-axis. The interconnect structure 268 further comprises various interlayer dielectric (ILD) layers (not shown or numbered) in which the metal layers and via layers are embedded. The metal layers and via layers of the interconnect structure 268 are configured to electrically couple various elements or circuits of the IC device 200 with each other, and with external circuitry. For simplicity, metal layers and via layers above the M1 layer are omitted in FIG. 2.

The M0 layer comprises M0 conductive patterns 243, 244 correspondingly over and in electrical contact with the VG via 241 and VD via 242. In some embodiments, the M0 conductive pattern 243 corresponds to the M0 conductive pattern 142, and/or the M0 conductive pattern 244 corresponds to the M0 conductive pattern 141, as described with respect to FIG. 1B. The V0 layer comprises V0 vias 245, 246 correspondingly over and in electrical contact with the M0 conductive patterns 243, 244. The M1 layer comprises M1 conductive patterns 247, 248 correspondingly over and in electrical contact with the V0 vias 245, 246. The V0 vias 245, 246 and the M1 conductive patterns 247, 248 provide electrical connections to the corresponding transistors formed over the active regions. In some embodiments, one or more of the V0 vias 245, 246 and M1 conductive patterns 247, 248 are omitted, for example, when cells are routed in the M0 layer through the corresponding M0 conductive patterns 243, 244.

The IC device 200 further comprises, on the back side 262, a back side interconnect structure 269 which comprises at least one back side metal layer, such as a back-side-metal-zero (BM0 or M0_B) layer under the back side 262 of the substrate 260. On the back side 262 of the substrate 260, the M0_B layer is the uppermost metal layer under, or the closest metal layer to, the active regions or source/drains of the transistors of the IC device 200. In at least one embodiment, the IC device 200 comprises one or more further via layers, dielectric layers and metal layers (not shown) under the M0_B layer to form interconnections among circuit elements of the IC device 200 and/or to form electrical connections to external circuitry. Via layers and metal layers from the M0_B layer and below are sometimes referred to as back side via layers and back side metal layers. An example material of back side vias and back side metal layers includes metal. Other configurations are within the scopes of various embodiments. For simplicity, dielectric layers, back side via layers, and back side metal layers lower than the M0_B layer are omitted from FIG. 2.

In the example configuration in FIG. 2, the M0_B layer comprises an M0_B conductive pattern 251 under and in electrical contact with a back side VD (VD_B) via 253 which, in turn, is under and in electrical contact with the active regions on the back side 262. The M0_B layer further comprises an M0_B conductive pattern 252 under and in electrical contact with a back side VG (VG_B) via 254 which, in turn, is under and in electrical contact with the gate portion 216 of the corresponding gate structure. In some embodiments, at least one of the M0_B conductive patterns 251, 252 is configured as an IO pattern of a cell, as described herein. In some embodiments, the M0_B conductive pattern 251 corresponds to a back side VDD or VSS power rail configured to supply the corresponding VDD or VSS to the corresponding source region 103 or 104, as described with respect to FIG. 1B. In some embodiments where the gate structures are not formed under the active regions, the gate portions 212, 214, 216 and the corresponding VG_B vias are omitted. In some embodiments, the back side interconnect structure 269 and corresponding VD_B vias are omitted.

In some embodiments, an example process of designing an IC (or IC device) utilizes one or more electronic design automation (EDA) tools for generating, optimizing and/or verifying a design of an IC before and/or after manufacturing the IC. At an IC design generation operation, a design of an IC is provided by a circuit designer. In some embodiments, the design of the IC comprises an IC schematic, i.e., an electrical diagram, of the IC. At a subsequent cell placement and routing operation, a layout diagram of the IC is generated based on the IC schematic. The cell placement and routing operation is referred to as Automatic Placement and Routing (APR) in at least one embodiment. In at least one embodiment, the IC layout diagram is generated by an EDA tool, such as an APR tool. Example operations by the APR tool include, but are not limited to, a cell placement operation and a routing operation. In a cell placement operation, the APR tool performs cell placement. Cells configured to provide pre-defined functions and having pre-designed layout diagrams are stored in one or more cell libraries. The APR tool accesses various cells from one or more cell libraries, and places the cells in an adjacent or abutting manner to generate an IC layout diagram corresponding to the IC schematic. In a routing operation, the APR tool performs routing to route various nets interconnecting the placed circuit elements. The routing is performed to ensure that the routed interconnections or nets satisfy a set of constraints. After the routing operation, the APR tool outputs the IC layout diagram including the placed circuit elements and routed nets. In some embodiments, one or more verifications are performed after the cell placement and routing operation. If one or more verifications are not passed, the IC schematic and/or the IC layout diagram are corrected and/or redesigned. If the verifications are passed, the IC layout diagram is output for manufacturing IC devices based on the IC layout diagram.

Some embodiments described herein are directed to an APR operation. In a first aspect, an APR operation in accordance with one or more embodiments utilizes cells with IO patterns restricted to a certain track in a metal layer. In a second aspect, an APR operation in accordance with one or more embodiments utilizes several versions of the same cell with corresponding IO patterns in different tracks in a metal layer. In a third aspect, an APR operation in accordance with one or more embodiments utilizes a cell having multiple IO patterns and/or floating conductive patterns configurable as IO patterns in different tracks in a metal layer. Example configurations in accordance with the first aspect are described with respect to FIGS. 3A-3B. Example configurations in accordance with the second aspect are described with respect to FIGS. 4A-4G. Example configurations in accordance with the third aspect are described with respect to FIGS. 5A-5I. Some embodiments include features of more than one, or all, of the described aspects.

Some embodiments described herein include one or more output patterns for a cell and one or more input patterns for another cell. However, the described output patterns and input patterns are interchangeable. For example, in some embodiments, the descriptions herein for output patterns are applicable to input patterns, and/or the descriptions herein for input patterns are applicable to output patterns.

Some embodiments described herein include IO patterns in the M0 layer and/or the M0_B layer. However, other metal layers are within the scopes of various embodiments. For example, complex cells have a high numbers of IO patterns and/or a high number of internal connections that require one or more IO patterns to be arranged in a front side metal layer other than the M0 layer (e.g., the M1 layer, or the like), and/or in a back side metal layer other than the M0_B layer (e.g., the M1_B layer, or the like). In some embodiments, the descriptions herein for the M0 layer (or another front side metal layer that contains IO patterns) are applicable to the M0_B layer (or another back side metal layer that contains IO patterns), and vice versa.

Figure 3B:
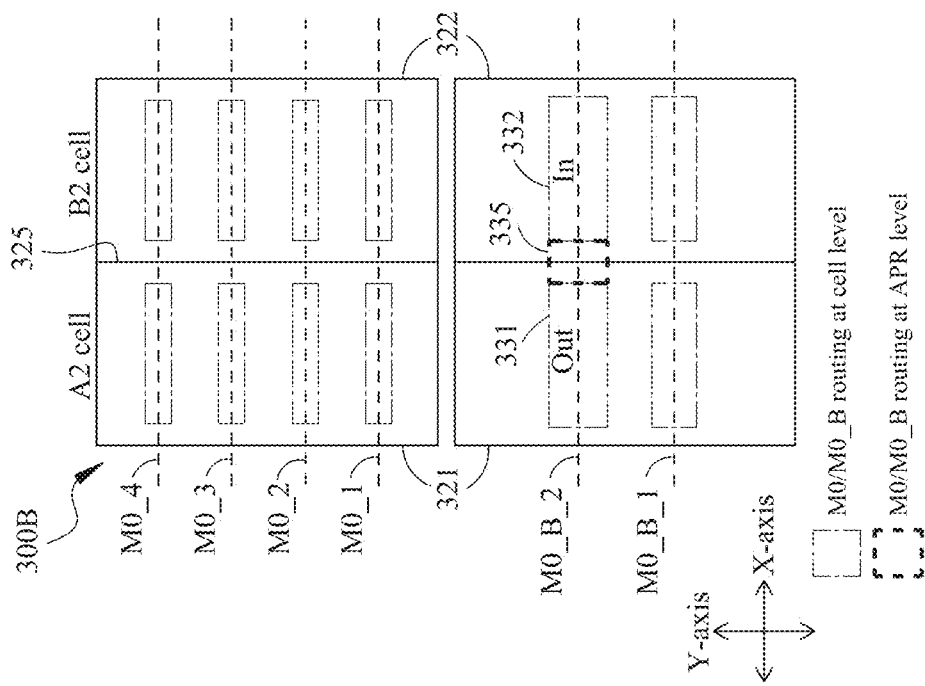
FIGS. 3A-3B are schematic views of various layout diagrams of one or more IC devices, in accordance with some embodiments.
Figure 3A:
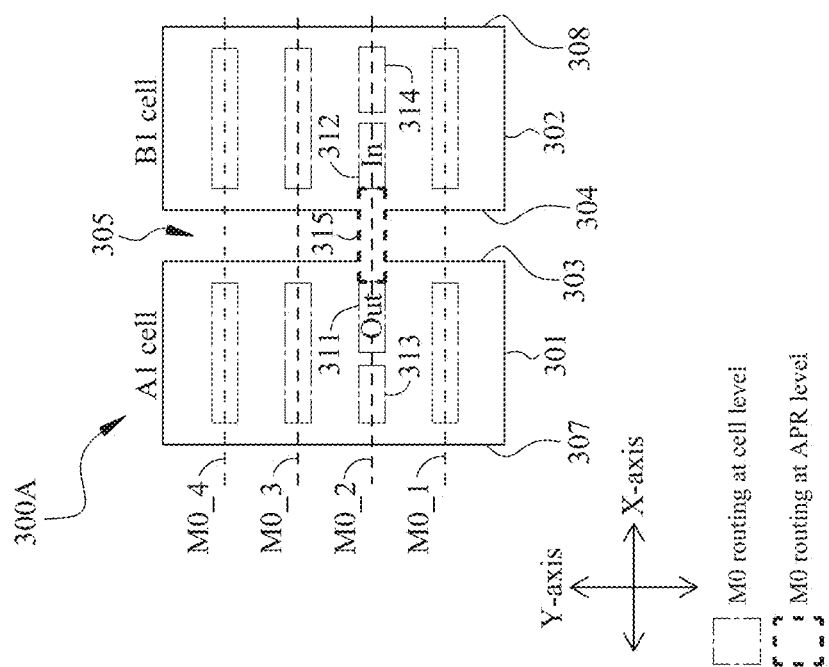

FIG. 3A is a schematic view of a layout diagram 300A of an IC device, in accordance with some embodiments. For simplicity, various features such as active regions, gate regions, MD contact structures, VD/VG vias, VG_B/VD_B vias, or the like, are omitted in FIGS. 3A-5I.

The layout diagram 300A comprises A1 cell and B1 cell. In accordance with an IC schematic corresponding to the layout diagram 300A, an output of A1 cell is to be electrically coupled to an input of B1 cell. An APR tool is configured to perform an APR operation to place and route A1 cell and B1 cell in the layout diagram 300A in accordance with the IC schematic.

In a cell placement operation, A1 cell is placed adjacent B1 cell along the X-axis in the layout diagram 300A. Specifically, A1 cell has a boundary 301, B1 cell has a boundary 302, and the boundary 301 of A1 cell has an edge 303 that faces, along the X-axis, an edge 304 of the boundary 302 of B1 cell. The facing edges 303, 304 are spaced from each other along the X-axis by a space 305. In at least one embodiment, the space 305 is not filled by a non-filler cell. In an example, the space 305 is a white space that is left empty and not filled by any cell. In another example, the space 305 is filled by one or more filler cells. The space 305 is an example of how two cells are placed adjacent each other. Another example of placing two cells adjacent each other includes placing the boundaries of the cells in abutment along a common edge, as described with respect to FIGS. 3B, 4A-4G and 5A-5I. In an example, at least one of A1 cell or B1 cell is an inverter cell as described herein. Other cell configurations are within the scopes of various embodiments.

In some embodiments, for a cell placement operation, A1 cell and B1 cell are retrieved from a cell library which includes cells with a restriction that IO patterns of the cells are arranged along a certain track in an IO pattern containing metal layer, e.g., the M0 layer. In the example configuration in FIG. 3A, IO patterns of cells are restricted to the track M0_2. Specifically, A1 cell has an output pattern 311 and B1 cell has an input pattern 312 both of which are along the track M0_2. As result, when A1 cell is placed adjacent to B1 cell in a cell placement operation, the output pattern 311 and the input pattern 312 are aligned along the X-axis. Two conductive patterns, such as the output pattern 311 and the input pattern 312, are aligned along a direction when the conductive patterns at least partially overlap when seen along the direction. The output pattern 311 and input pattern 312 correspondingly extend up to the facing edges 303 and 304 of the corresponding boundaries 301, 302. Each of A1 cell and B1 cell further comprises one or more M0 conductive patterns other than the corresponding output pattern 311 and input pattern 312. The M0 conductive patterns of A1 cell and B1 cell are arranged along the corresponding tracks M0_1, M0_2, M0_3, M0_4, and are included in the layout diagrams of A1 cell and B1 cell retrieved from the cell library. M0 conductive patterns already included in layout diagrams of cells retrieved from a cell library are schematically designated in the drawings as "M0 routing at cell level."

In a subsequent routing operation, a connecting pattern 315 is routed between the output pattern 311 and input pattern 312, in the same M0 layer that contains the output pattern 311 and input pattern 312. The connecting pattern 315 is contiguous to, and aligned along the X-axis with, both of the output pattern 311 and input pattern 312. The connecting pattern 315 is an example of M0 conductive patterns added or routed by an APR tool in a routing operation. Such M0 conductive patterns are schematically designated in the drawings as "M0 routing at APR level." Although the output pattern 311, the input pattern 312, and the connecting pattern 315 are added to the layout diagram 300A by different operations and schematically designated differently in the drawings, in an IC device manufactured in accordance with the layout diagram 300A, a single continuous M0 conductive pattern corresponds to the output pattern 311, the input pattern 312, and the connecting pattern 315.

In the example configuration in FIG. 1B, each of the output pattern 311 and input pattern 312 is accessible for routing from one side of the corresponding boundary 301, 302. However, other configurations are within the scopes of various embodiments, as described with respect to FIGS. 1B-1G. For example, in one or more embodiments, the output pattern 311 extends continuously up to both opposite edges 303, 307 of the boundary 301, to be accessible for routing from both sides of the boundary 301. In a further example, the input pattern 312 extends continuously up to both opposite edges 304, 308 of the boundary 302, to be accessible for routing from both sides of the boundary 302. In another example, A1 cell, as retrieved from a cell library, has the output pattern accessible for routing from the side opposite to B1 cell. In other words, A1 cell, as retrieved from the cell library, has the output pattern 311 on the left and M0 conductive pattern 313 on the right. In such situation, before placing A1 cell in the layout diagram 300A, the APR tool is configured to transform A1 cell, e.g., flip A1 cell horizontally across the Y-axis, in a manner similar to that described with respect to FIG. 4D. As a result, the output pattern 311 is rearranged from the left side to the right side for facing B1 cell, so that it is possible to route the connecting pattern 315 between the output pattern 311 of the horizontally flipped A1 cell and the input pattern 312 of B1 cell. In yet another example, B1 cell, as retrieved from a cell library, has the input pattern accessible for routing from the side opposite to A1 cell. In other words, B1 cell, as retrieved from the cell library, has the input pattern 312 on the right and M0 conductive pattern 314 on the left. In such situation, before placing B1 cell in the layout diagram 300A, the APR tool is configured to flip B1 cell horizontally across the Y-axis, to rearrange the input pattern 312 from the right side to the left side for facing A1 cell, so that it is possible to route the connecting pattern 315 between the output pattern 311 of A1 cell and the input pattern 312 of the horizontally flipped B1 cell. In some embodiments, the M0 conductive pattern 313 is configured as an input pattern of A1 cell for routing to an output pattern of another cell of the left of A1 cell, and/or the M0 conductive pattern 314 is configured as an output pattern of B1 cell for routing to an input pattern of another cell of the right of B1 cell.

In at least one embodiment, by including cells having IO patterns along a certain track of the M0 layer, or another IO pattern containing metal layer, when two of such cells are placed adjacent each other, with or without a horizontal flipping operation as described, corresponding IO patterns of the placed cells are aligned with each other and ready for a simple routing operation to electrically couple the placed cells. The simple routing operation comprises generating, in the same IO pattern containing metal layer, a connecting pattern along the same track and contiguous to the corresponding IO patterns of the placed cells. In contrast, in other approaches, it is possible that corresponding IO patterns of placed cells are arranged along different tracks, requiring more complex routing through one or more conductive patterns in one or more further metal layers as well as vias between the metal layers. Such complex routing requires additional routing resources and/or chip area, and potentially affects performance of manufactured IC devices due to the longer routing paths or nets. At least one embodiment provides various improvements over the other approaches, including, but not limited to, reduction in required routing resources and/or chip area, improved performance of manufactured IC devices because of the shorter routing paths or nets, increased or maximized usage of connections in the M0 layer, or the like.

FIG. 3B is a schematic view of a layout diagram 300B of an IC device, in accordance with some embodiments.

The layout diagram 300B comprises A2 cell and B2 cell. A2 cell is placed adjacent B2 cell along the X-axis in the layout diagram 300B. While A1 cell and B1 cell are placed adjacent each other in the layout diagram 300A with a space 305 therebetween, A2 cell and B2 cell in the layout diagram 300B are placed in abutment. Specifically, A2 cell has a boundary 321, B2 cell has a boundary 322, and the boundary 321 of A2 cell and the boundary 322 of B2 cell are placed in abutment along a common edge 325.

A further difference between the layout diagram 300A and layout diagram 300B is that A2 cell and B2 cell in the layout diagram 300B further comprise various conductive patterns in a back side metal layer, such as the M0_B layer. For each of A2 cell and B2 cell schematically illustrated in FIG. 3B, the upper part shows M0 conductive patterns arranged along tracks M0_1, M0_2, M0_3, M0_4 in the M0 layer within the corresponding boundary 321, 322, whereas the lower part shows M0_B conductive patterns arranged along tracks M0_B_1, M0_B_2 in the M0_B layer within the same corresponding boundary 321, 322. The number of two M0_B tracks over each of A2 cell and B2 cell is an example. Other number of M0_B tracks over each cell are within the scopes of various embodiments. In the example configuration in FIG. 3B, the M0_B conductive patterns have a greater width along the Y-axis than the M0 conductive patterns. Other metal scheme configurations are within the scopes of various embodiments.

The layout diagram 300B is an example of using a cell library which includes cells with a restriction that IO patterns of the cells are arranged along a certain track in a back side IO pattern containing metal layer, e.g., the M0_B layer.

In the example configuration in FIG. 3B, IO patterns of cells in a cell library are restricted to the track M0_B_2. M0_B conductive patterns of A2 cell and B2 cell, which are included in the layout diagrams of A2 cell and B2 cell retrieved from the cell library, are schematically designated in the drawings as "M0_B routing at cell level." Such M0_B conductive patterns include an output pattern 331 of A2 cell and a corresponding input pattern 332 of B2 cell. Both output pattern 331 and corresponding input pattern 332 are arranged along the track M0_B_2. As result, when A2 cell is placed in abutment with B2 cell in a cell placement operation, the output pattern 331 and the input pattern 332 are aligned along the X-axis. In a subsequent routing operation, a connecting pattern 335 is routed between the output pattern 331 and input pattern 332, in the same M0_B layer that contains the output pattern 331 and input pattern 332. The connecting pattern 335 is contiguous to, and aligned along the X-axis with, both of the output pattern 331 and input pattern 332. The connecting pattern 335 is an example of M0_B conductive patterns added or routed by an APR tool in a routing operation. Such M0_B conductive patterns are schematically designated in the drawings as "M0_B routing at APR level." Although the output pattern 331, the input pattern 332, and the connecting pattern 335 are added to the layout diagram 300A by different operations and schematically designated differently in the drawings, in an IC device manufactured in accordance with the layout diagram 300B, a single continuous M0_B conductive pattern corresponds to the output pattern 331, the input pattern 332, and the connecting pattern 335.

In some embodiments, a combination of the layout diagram 300A and layout diagram 300B is implemented, i.e., cells retrieved from a cell library for generation of a layout diagram have corresponding IO patterns restricted to both a track in a front side metal layer, e.g., the M0_B layer, and to a track in a back side metal layer, e.g., the M0_B layer. In at least one embodiment, one or more advantages described herein with respect to the layout diagram 300A are achievable by the layout diagram 300B.

Figure 4A:
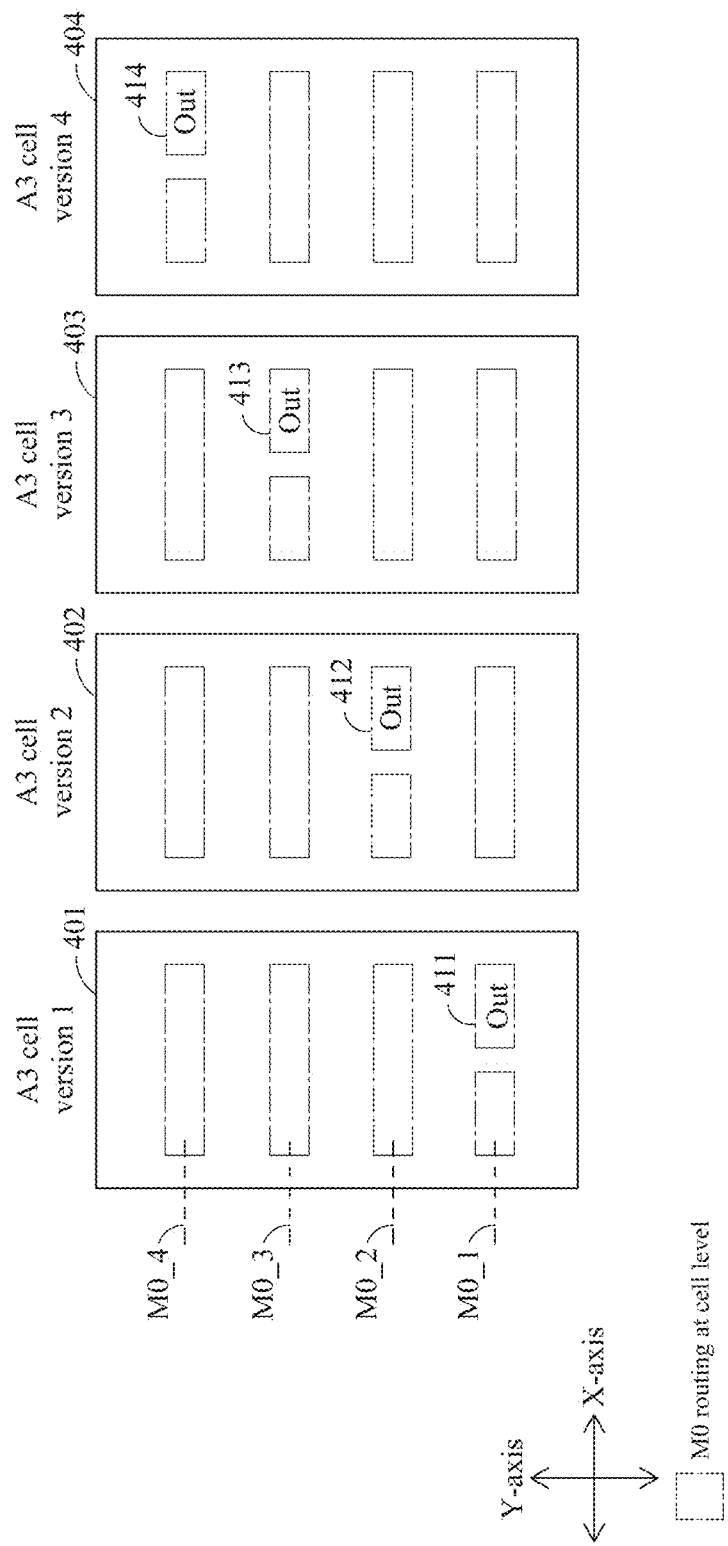
FIG. 4A includes schematic views of layout diagrams of various versions of a cell, and FIGS. 4B-4D include schematic views of various layout diagrams of one or more IC devices including various versions of the cell, in accordance with some embodiments.
Figure 4B:
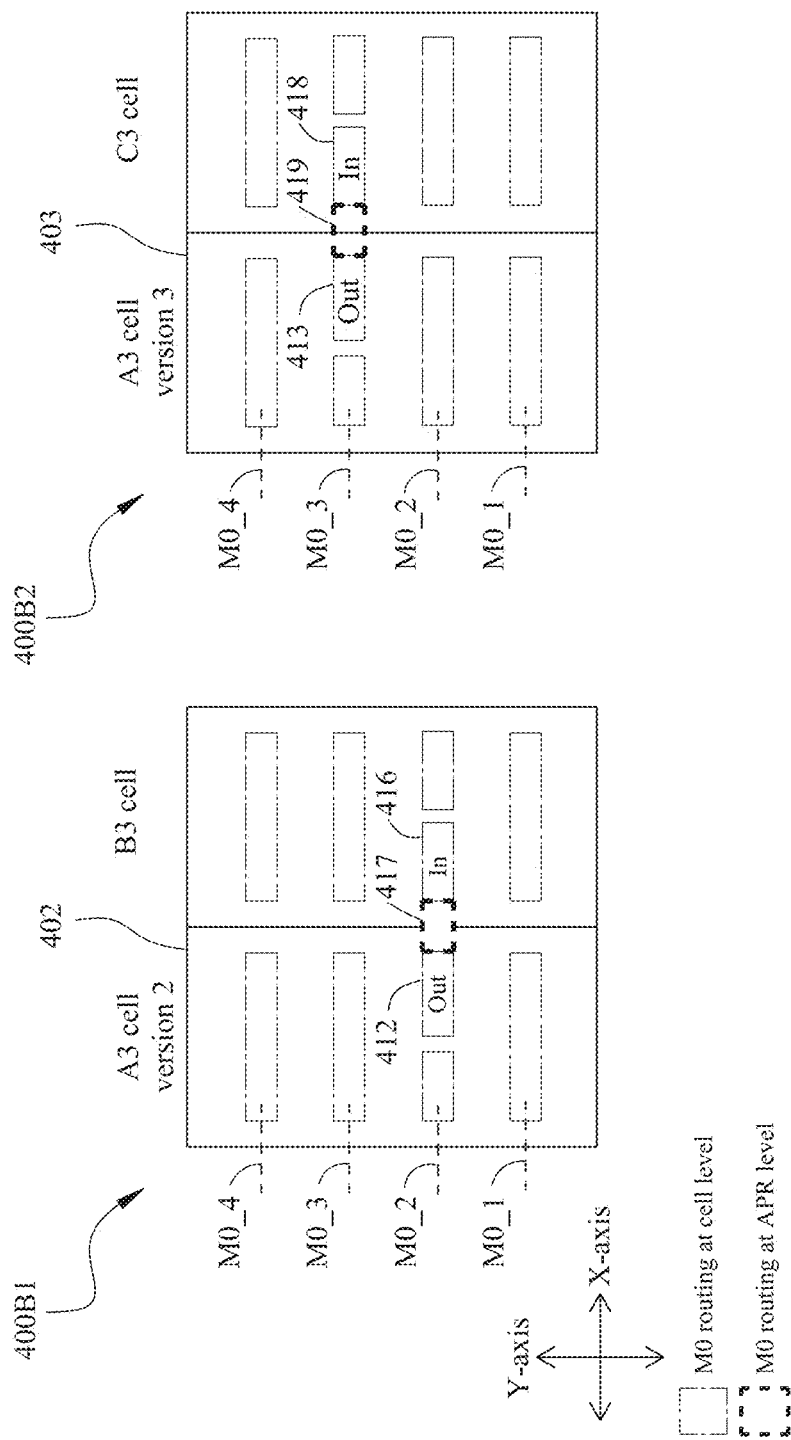
FIG. 4E includes schematic views of layout diagrams of various versions of a cell, and FIG. 4F includes schematic views of various layout diagrams of one or more IC devices including various versions of the cell, in accordance with some embodiments.
FIG. 4G includes schematic views of layout diagrams of various versions of a cell, in accordance with some embodiments.
Figure 4C:
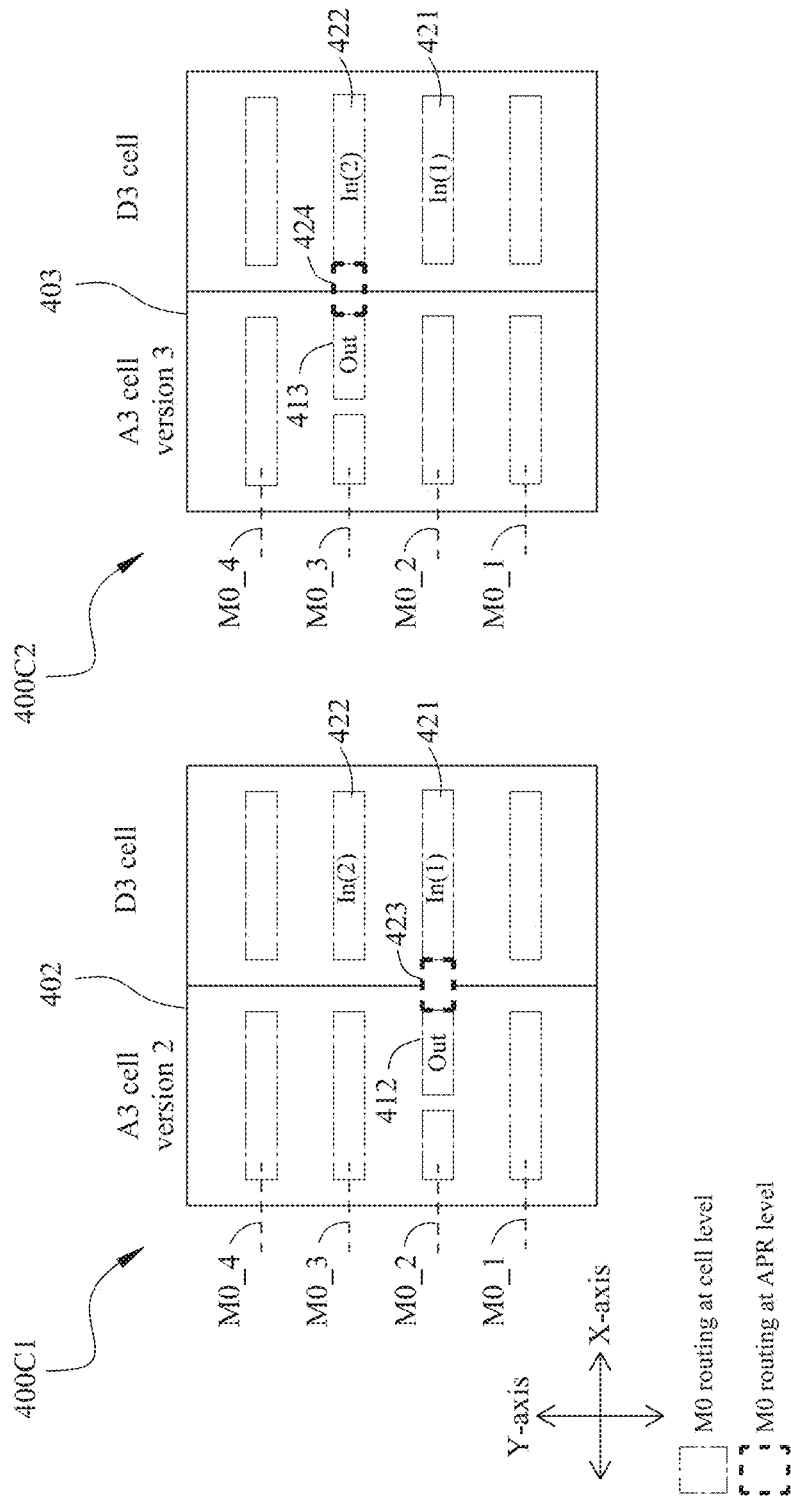
Figure 4D:
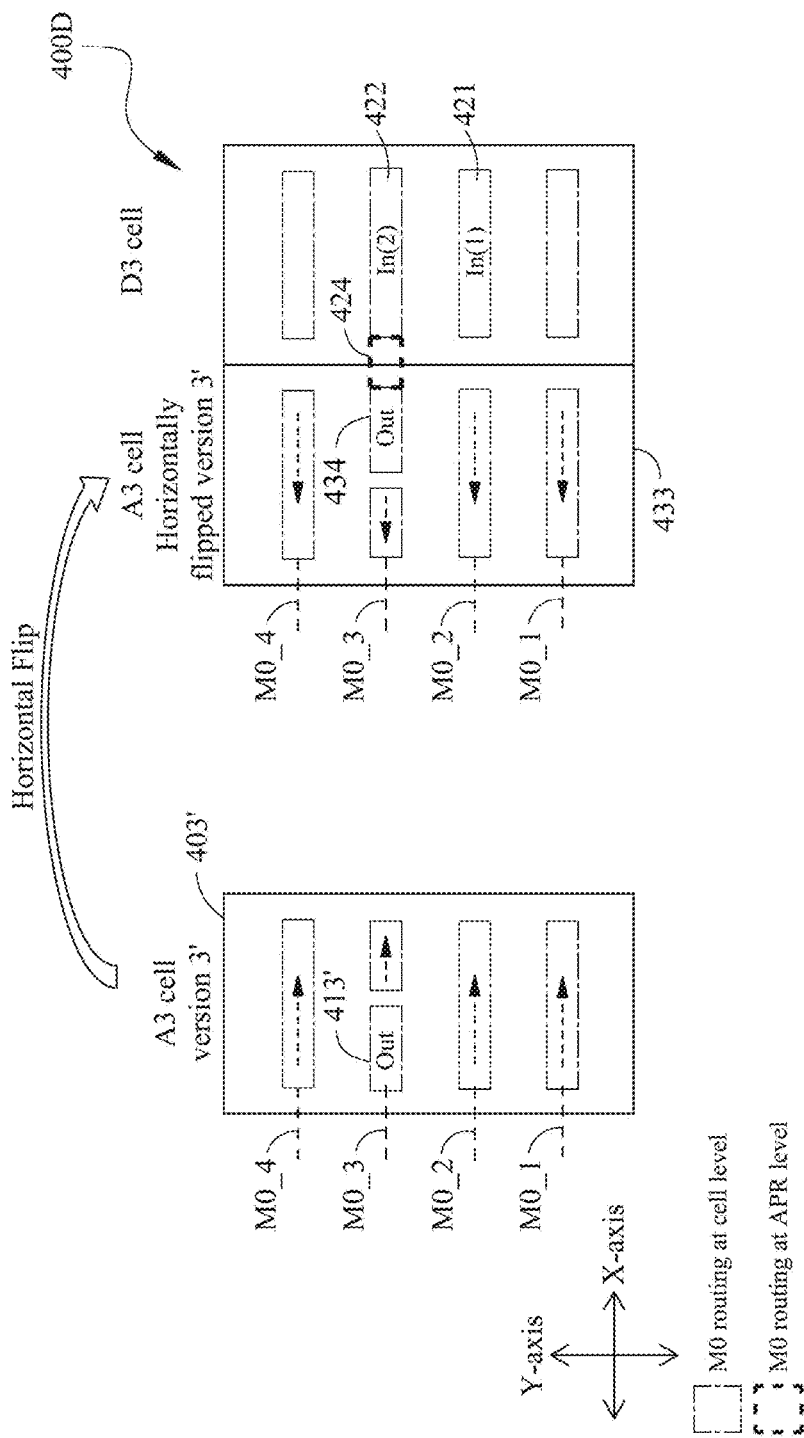

FIG. 4A includes schematic views of layout diagrams of various versions of a cell, and FIGS. 4B-4D include schematic views of various layout diagrams of one or more IC devices including various versions of the cell, in accordance with some embodiments.

In FIG. 4A, cells 401-404 are various versions 1-4 of A3 cell. The cells 401-404 have the same circuitry, but with corresponding IO patterns along different tracks in a metal layer. For example, output patterns 411-414 of the cells 401-404 are M0 conductive patterns arranged correspondingly along tracks M0_1, M0_2, M0_3, M0_4. Example configurations for the cells 401-404 are inverter cells described with respect to FIGS. 1C-1F. Other cell configurations are within the scopes of various embodiments. In some embodiments, the cells 401-404 are stored in a cell library and are selectively interchangeable in an APR operation, as described herein.

FIG. 4B includes schematic views of layout diagrams 400B1, 400B2 of one or more IC devices using different versions of A3 cell, in accordance with some embodiments.

In the layout diagram 400B1, an IC schematic corresponding to the layout diagram 400B1 being generated indicates that A3 cell is to be placed adjacent and routed to B3 cell. An APR tool determines that B3 cell has an input pattern 416 arranged along the track M0_2. The APR tool then selects, from various versions 1-4 of A3 cell in a cell library, the version having a corresponding output pattern along the same track M0_2. As a result, the cell 402 (version 2 of A3 cell) is selected by the APR tool to be placed adjacent and routed to B3 cell. For example, the cell 402 is placed in abutment with B3 cell in a cell placement operation, and a connecting pattern 417 is routed in a routing operation between the output pattern 412 of the cell 402 and the corresponding input pattern 416 of B3 cell.

In the layout diagram 400B2, an IC schematic corresponding to the layout diagram 400B2 being generated indicates that A3 cell is to be placed adjacent and routed to C3 cell. An APR tool determines that C3 cell has an input pattern 418 arranged along the track M0_3. The APR tool then selects, from various versions 1-4 of A3 cell in a cell library, the version having a corresponding output pattern along the same track M0_3. As a result, the cell 403 (version 3 of A3 cell) is selected by the APR tool to be placed adjacent and routed to C3 cell. For example, the cell 403 is placed in abutment with C3 cell in a cell placement operation, and a connecting pattern 419 is routed in a routing operation between the output pattern 413 of the cell 403 and the corresponding input pattern 418 of C3 cell.

In at least one embodiment, one or more advantages described herein with respect to the layout diagram 300A are achievable by the layout diagrams 400B1, 400B2. Further, in one or more embodiments, the provision of multiple versions of a cell (e.g., A3 cell) with corresponding IO patterns along different tracks in a metal layer increases the flexibility and/or likelihood of APR success, because it is possible to relax or eliminate a requirement with respect to a specific track or tracks along which IO patterns of the other cells (e.g., B3 cell and C3 cell) are to be arranged.

FIG. 4C includes schematic views of layout diagrams 400C1, 400C2 of one or more IC devices using different versions of A3 cell, in accordance with some embodiments.

A difference between the layout diagrams in FIGS. 4B and 4C is that D3 cell to be placed adjacent and routed to A3 cell in the layout diagrams in FIG. 4C has multiple IO patterns which are swappable with each other. For example, D3 cell comprises input patterns 421, 422 corresponding to two different inputs In(1), In(2) for the internal circuitry of D3 cell. The inputs In(1), In(2) are swappable with each other when it is possible to swap data supplied to the inputs In(1), In(2) without changing a function configured to be performed by D3 cell. In an example, D3 cell is a two-input AND gate. The two inputs of such a two-input AND gate are swappable, because one set of data can be supplied to any one of the two inputs and another set of data can be supplied to the other input without changing a result of the AND logic function the AND gate is configured to perform. Other cell configurations with swappable IO patterns are within the scopes of various embodiments.

In an example APR operation, an APR tool determines from an IC schematic that an output of A3 cell is to be routed to the input In(1) of D3 cell. As described with respect to FIG. 4B, the APR tool searches, in a cell library, for a version of A3 cell that has an output pattern along the same track M0_2 as the input pattern 421 corresponding to the input In(1) of D3 cell. When such a version of A3 cell, i.e., the cell 402, is found, the cell 402 is placed adjacent D3 cell, and the corresponding output pattern 412 is routed by a connecting pattern 423 along the same track M0_2 to the input pattern 421 corresponding to the input In(1) of D3 cell. As a result, the layout diagram 400C1 is obtained.

However, when the cell 402 is not included in the cell library, i.e., when the APR tool determines that no version of A3 cell in the cell library has the corresponding IO pattern along the track M0_2, the APR tool switches to search for a version of A3 cell that has an output pattern along another track M0_3 along which the input pattern 422 corresponding to the other, swappable input In(2) of D3 cell is arranged. When such a version of A3 cell, i.e., the cell 403, is found, the cell 403 is placed adjacent D3 cell, and the corresponding output pattern 413 is routed by a connecting pattern 424 along the track M0_3 to the input pattern 422 corresponding to the other input In(2) of D3 cell. As a result, the layout diagram 400C2 is obtained. In at least one embodiment, one or more advantages described herein with respect to one or more of the layout diagram(s) in FIG. 4B are achievable by one or more of the layout diagram(s) in FIG. 4C.

FIG. 4D includes a schematic view of a layout diagram of a cell 403', and a schematic view of a layout diagram 400D of one or more IC devices including a modified version of cell 403', in accordance with some embodiments.

In FIG. 4D, the cell 403' is similar to the cell 403 in FIGS. 4A-4C in that the cell 403' is a version 3' of A3 cell with an output pattern 413' along the track M0_3 for routing to the corresponding input pattern 422 of D3 cell. However, the output pattern 413' of the cell 403' is accessible for routing from the left side of the cell 403', instead of the right side that faces the corresponding input pattern 422. This situation may arise, for example, when an APR tool found in a cell library the cell 403' with the output pattern 413' on the right track but on the wrong side, instead of the cell 403 with the output pattern 413 on the right track and on the correct side with respect to D3 cell.

When the APR tool determines that the output pattern 413' is on the wrong side, the APR tool performs a horizontal flip to flip the cell 403' horizontally across the Y-axis. As a result, a cell 433 is obtained. The cell 433 is a horizontally flipped version 3' of A3 cell. The dot-dot arrows on the M0 conductive patterns of the cells 403' and 433 schematically indicate that the cell 433 is a horizontally flipped version of the cell 403'. In the cell 433, an output pattern 434 corresponds to the output pattern 413' and is rearranged from the left side to the right side for facing D3 cell. The APR tool places the cell 433 in abutment with D3 cell, and routes a connecting pattern 424 along the track M0_3 between the output pattern 434 and the corresponding input pattern 422. As a result, the layout diagram 400D is obtained.

In at least one embodiment, one or more advantages described herein with respect to one or more of the layout diagram(s) in FIG. 4C are achievable by one or more of the layout diagram(s) in FIG. 4D. Further, in at least one embodiment, when an IO pattern is accessible from one side in a version of a cell, it is not necessary to store another version of the cell in a cell library to provide the IO pattern along the same track but accessible from the other side. Instead, an APR tool is configured to generate a horizontally flipped version of a version already available in the cell library so that the IO pattern becomes accessible from the desired side. As a result, in one or more embodiments, it is possible to reduce the number of versions of a cell to be included in a cell library. In some embodiments, an IO pattern of a cell is not limited or restricted to be accessible for routing from a specific side or edge of the cell, because the cell may be later flipped by an APR tool to be accessible from another side. As a result, cell design requirements are relaxed, in one or more embodiments.

Figure 4E:
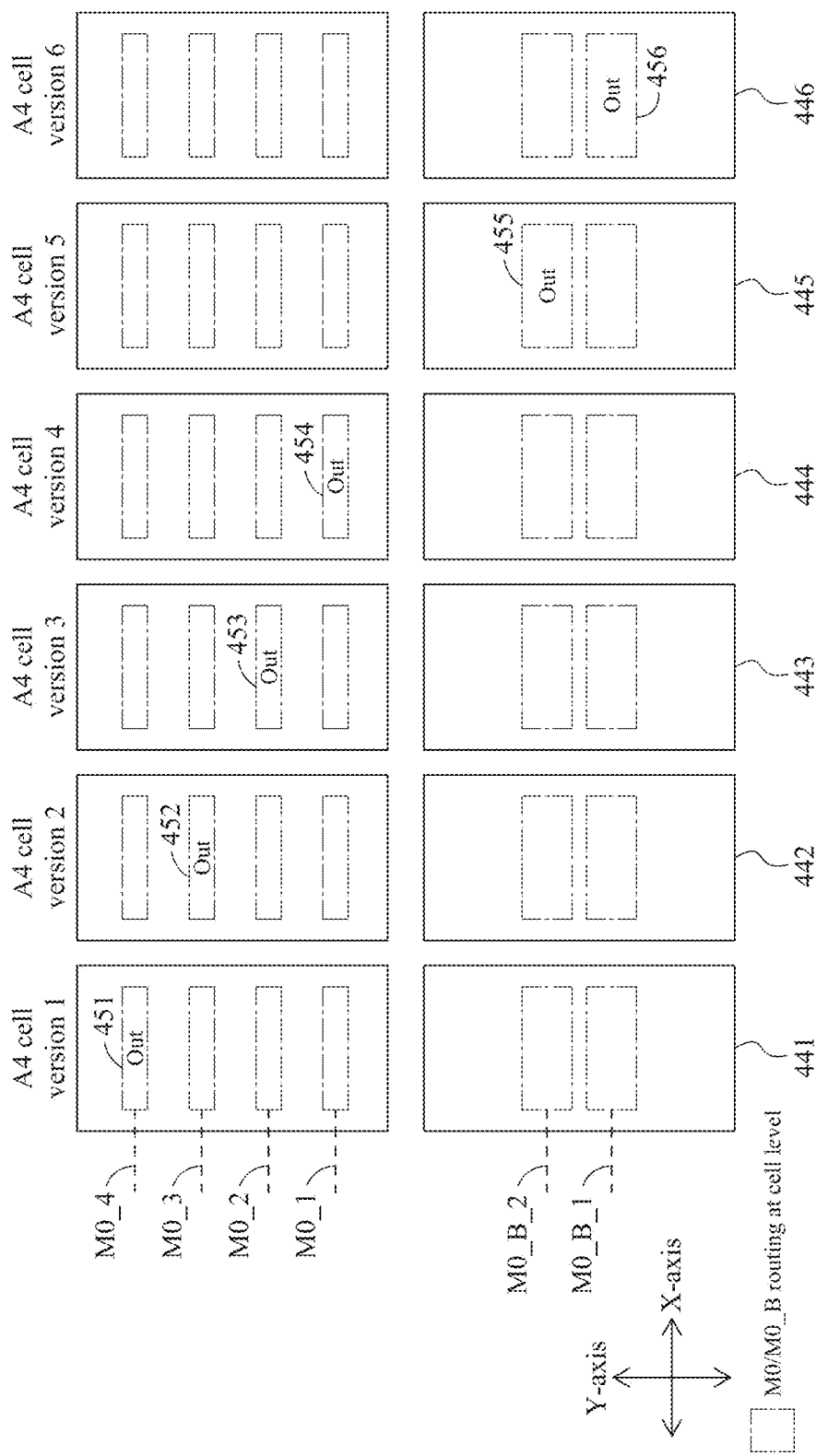
Figure 4F:
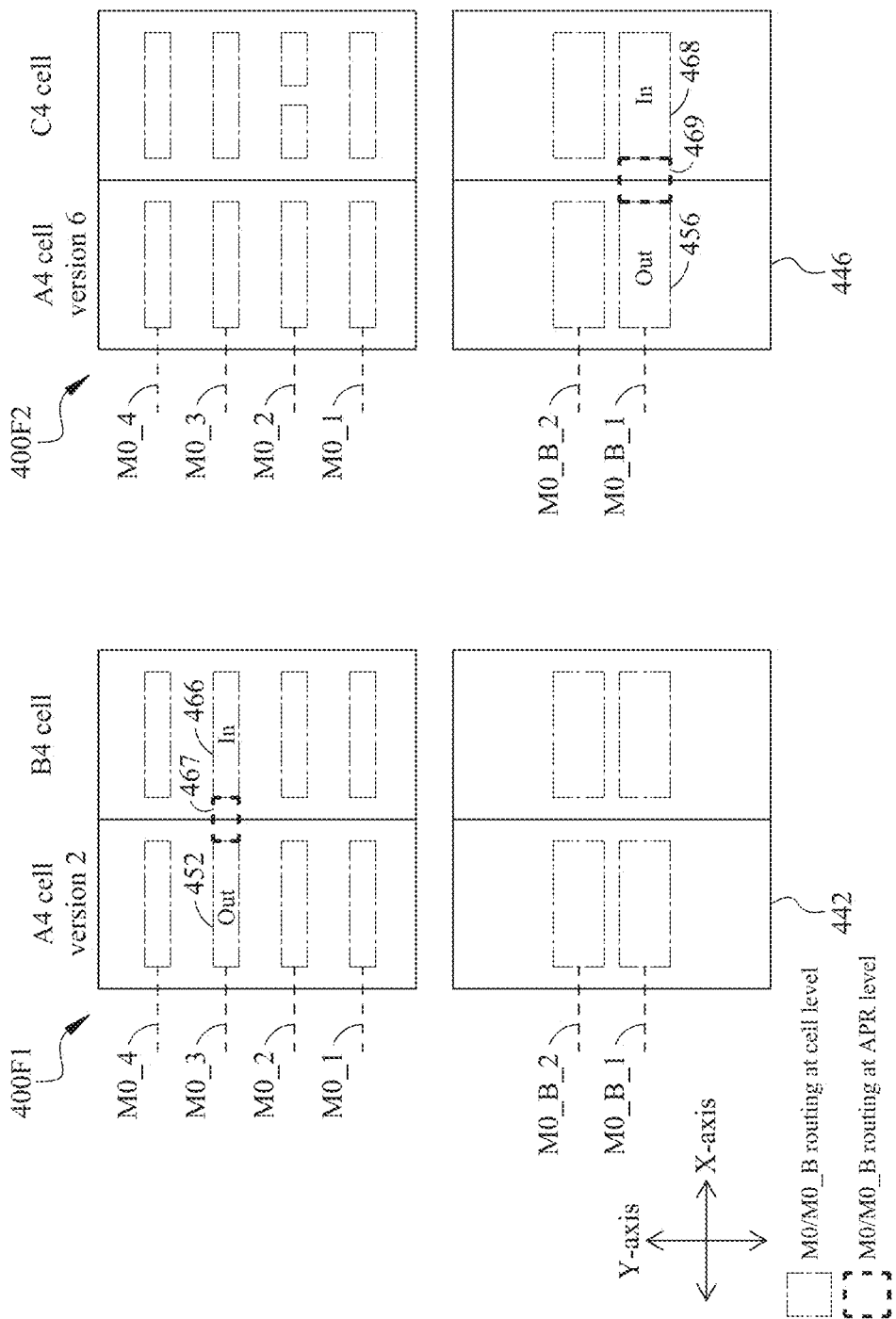

FIG. 4E includes schematic views of layout diagrams of various versions of a cell, and FIG. 4F includes schematic views of various layout diagrams of one or more IC devices including various versions of the cell, in accordance with some embodiments.

In FIG. 4E, cells 441-446 are various versions 1-6 of A4 cell. The cells 441-446 have the same circuitry, but with corresponding IO patterns along different tracks in a front side metal layer and a back side metal layer. For example, output patterns 451-454 of the cells 441-444 are M0 conductive patterns arranged correspondingly along tracks M0_4, M0_3, M0_2, M0_1, whereas output patterns 455-456 of the cells 445-446 are M0_B conductive patterns arranged correspondingly along tracks M0_B_2, M0_B_1. In some embodiments, the cells 441-446 are stored in a cell library and are selectively interchangeable in an APR operation, as described herein.

FIG. 4F includes schematic views of layout diagrams 400F1, 400F2 of one or more IC devices using different versions of A4 cell, in accordance with some embodiments.

In the layout diagram 400F1, an IC schematic corresponding to the layout diagram 400F1 being generated indicates that A4 cell is to be placed adjacent and routed to B4 cell which has conductive patterns in the M0_B layer and the M0_B layer. An APR tool determines that B4 cell has an input pattern 466 arranged in the M0 layer and along the track M0_3. The APR tool then selects, from various versions 1-4 of A4 cell in a cell library, the version having a corresponding output pattern along the same track M0_3. As a result, the cell 442 (version 2 of A4 cell) is selected by the APR tool to be placed adjacent and routed to B4 cell. For example, the cell 402 is placed in abutment with B4 cell in a cell placement operation, and a connecting pattern 467 is routed in the M0 layer and by a routing operation between the output pattern 452 of the cell 442 and the corresponding input pattern 466 of B4 cell.

In the layout diagram 400F2, an IC schematic corresponding to the layout diagram 400F2 being generated indicates that A4 cell is to be placed adjacent and routed to C4 cell. An APR tool determines that C4 cell has an input pattern 468 arranged in the M0_B layer and along the track M0_B_1. The APR tool then selects, from various versions 5-6 of A4 cell in a cell library, the version having a corresponding output pattern along the same track M0_B_1. As a result, the cell 446 (version 6 of A4 cell) is selected by the APR tool to be placed adjacent and routed to C4 cell. For example, the cell 446 is placed in abutment with C4 cell in a cell placement operation, and a connecting pattern 469 is routed in the M0_B layer and by a routing operation between the output pattern 456 of the cell 446 and the corresponding input pattern 468 of C4 cell.

In at least one embodiment, one or more advantages described herein with respect to the layout diagram 300B are achievable by the layout diagrams 400F1, 400F2. Further, in one or more embodiments, the provision of multiple versions of a cell (e.g., A4 cell) with corresponding IO patterns along different tracks in a front side metal layer and a back side metal layer increases the flexibility and/or likelihood of APR success, because it is possible to relax or eliminate a requirement with respect to a specific track or tracks along which IO patterns of the other cells (e.g., B4 cell and C4 cell) are to be arranged. In some embodiments, one or more features and/or advantages associated with a cell with multiple swappable IO patterns as described with respect to FIGS. 4C, 4D are also applicable and/or achievable in one or more cells and/or layout diagrams of IC devices described with respect to FIGS. 4E, 4F.

Figure 4G:
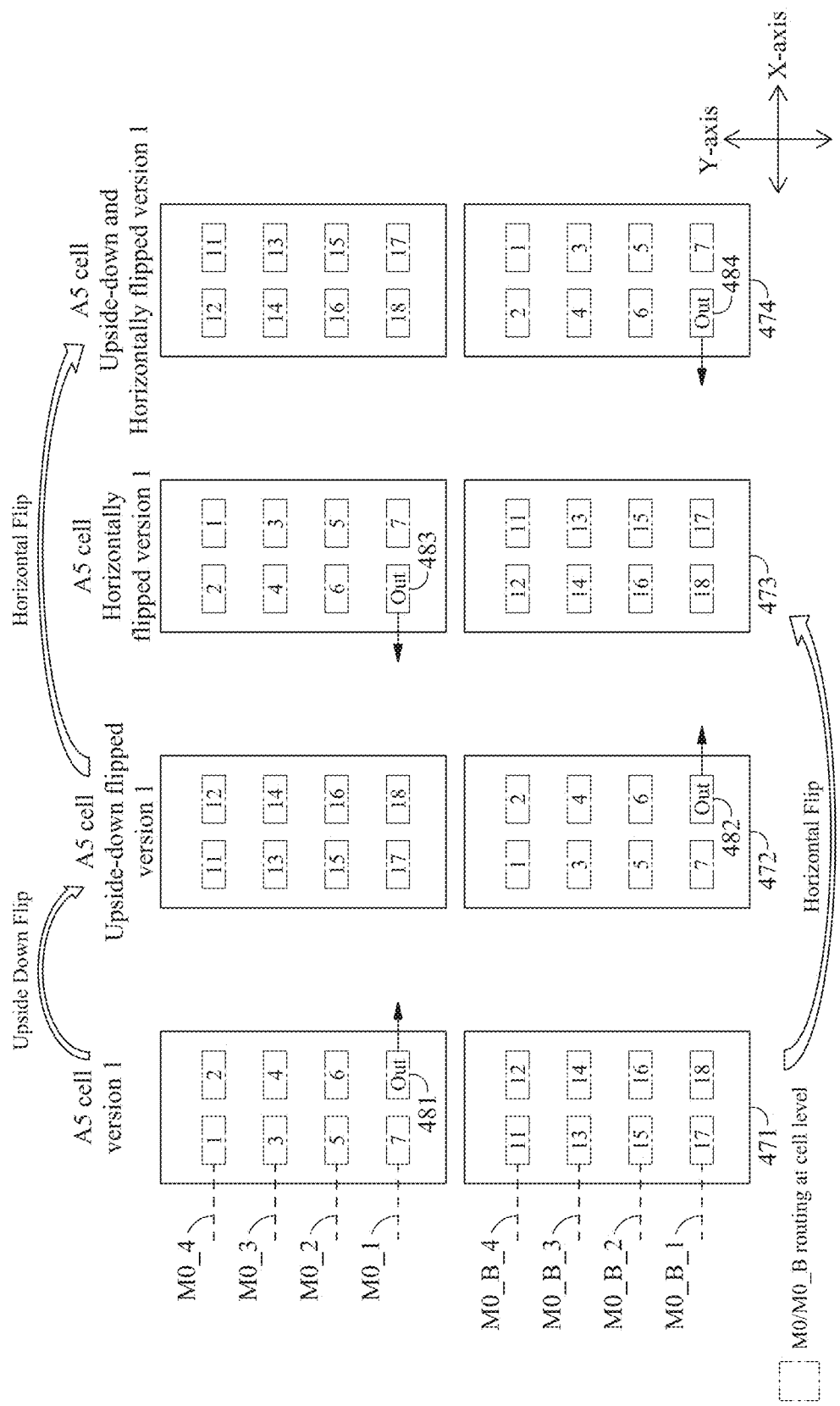

FIG. 4G includes schematic views of layout diagrams of various versions of a cell, in accordance with some embodiments.

In FIG. 4G, a cell 471 corresponds to version 1 of A5 cell, with an output pattern 481 in the M0 layer along the track M0_1. In at least one embodiment, other versions of A5 cell with corresponding output patterns in the M0 layer and along the other tracks M0_2, M0_3, M0_4 are provided, but not shown in FIG. 4G. Like A4 cell described with respect to FIGS. 4E-4F, A5 cell in FIG. 4G includes conductive patterns in both the M0 layer and the M0_B layer. A difference between A4 cell in FIGS. 4E-4F and A5 cell in FIG. 4G is that, in A5 cell, M0_B conductive patterns have the same design as M0 conductive patterns. For example, in A5 cell, M0_B conductive patterns have the same number of tracks (i.e., four tracks M0_B_1, M0_B_2, M0_B_3, M0_B_4), the same pitch between the tracks, the same size (e.g., the same conductive pattern width along the Y-axis) as those of M0 conductive patterns. In other words, conductive patterns in the M0 layer and the M0_B layer are interchangeable by a transformation, e.g., an upside down flip, performed by an APR tool.

For example, a cell 472 is an upside-down flipped version of the cell 471. In an upside down flip, positions of the M0 conductive patterns and positions of the M0_B conductive patterns are switched. For example, conductive patterns 1-7 and the output pattern 481 in the M0 layer of the cell 471 become corresponding conductive patterns 1-7 and an output pattern 482 in the M0_B layer of the cell 472, and conductive patterns 11-18 in the M0_B layer of the cell 471 become corresponding conductive patterns 11-18 in the M0 layer of the cell 472. Further, VD/VG vias electrically coupled to the M0 conductive patterns in the cell 471 become corresponding VD_B/VG_B vias electrically coupled to the corresponding M0_B conductive patterns in the cell 472, and VD_B/VG_B vias electrically coupled to the M0_B conductive patterns in the cell 471 become corresponding VD/VG vias electrically coupled to the corresponding M0 conductive patterns in the cell 472. Like the output pattern 481 of the cell 471, the corresponding output pattern 482 of the cell 472 are accessible from the right side as schematically indicated in FIG. 4G by the arrows associated with the output patterns 481, 482.

A cell 473 is a horizontally flipped version of the cell 471, and is generated by an APR tool performing a horizontal flip of the cell 471. An output pattern 483 in the cell 473 corresponds to the output pattern 411 in the cell 471, but is accessible from the opposite, i.e., left, side as schematically indicated in FIG. 4G by the arrow associated with the output pattern 483.

A cell 474 is a horizontally flipped version of the cell 472, and is generated by an APR tool performing a horizontal flip of the cell 472. The cell 474 is also an upside-down flipped version of the cell 473 and can be generated by an APR tool performing an upside down flip of the cell 473. An output pattern 484 in the cell 474 corresponds to the output pattern 482 in the cell 472, but is accessible from the opposite, i.e., left, side as schematically indicated in FIG. 4G by the arrow associated with the output pattern 484. In some embodiments, an APR tool is configured to perform horizontal flips even when the design of the M0 layer is different from the M0_B layer.

In at least one embodiment, although a limited number of versions of a cell is contained in a cell library, an APR tool is configured to generate additional versions of the same cell, by performing at least one of a horizontal flip or an upside-down flip. As a result, it is possible in one or more embodiments to reduce the number of versions of a cell to be included in a cell library. In at least one embodiment, one or more advantages described herein are achievable by one or more cells described with respect to FIG. 4G.

Figure 5A:
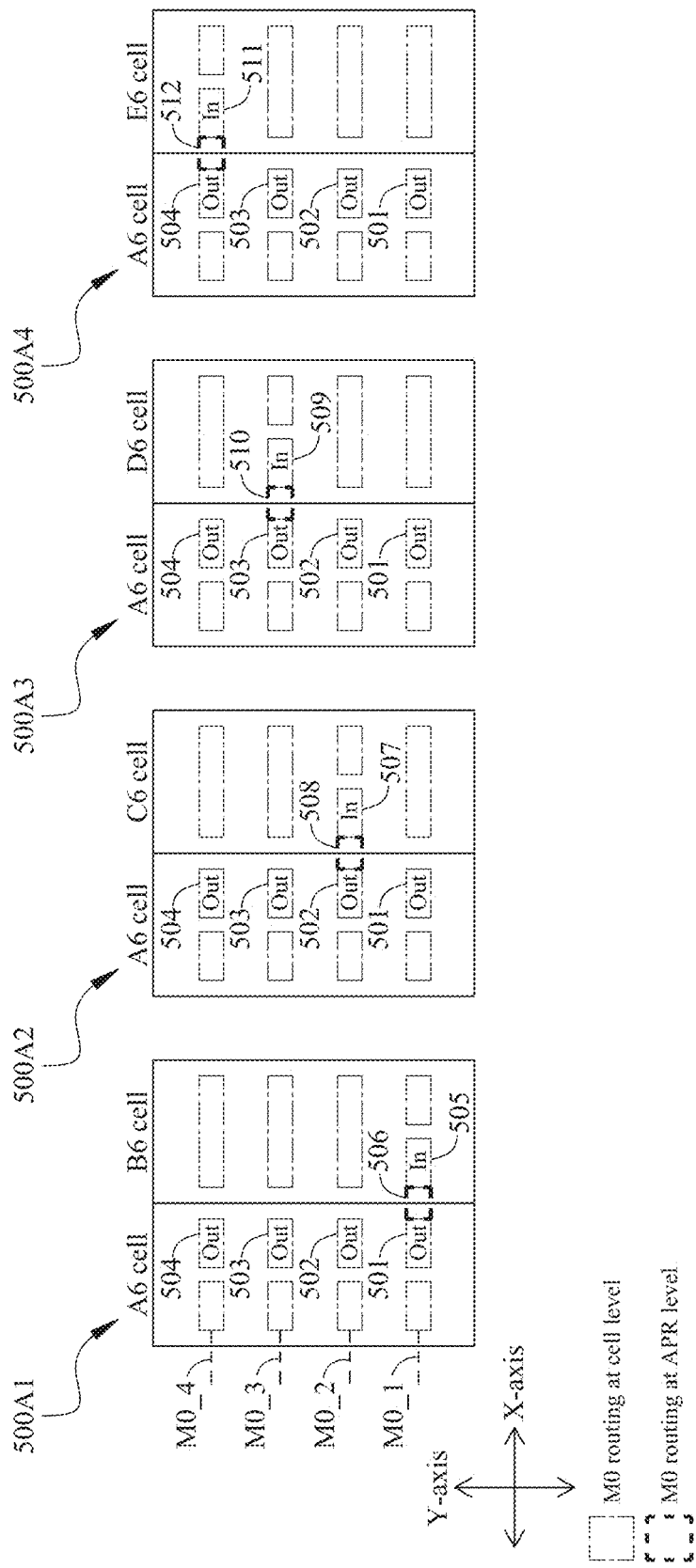
FIGS. 5A-5E each include schematic views of various layout diagrams of one or more IC devices, in accordance with some embodiments.

FIG. 5A includes schematic views of various layout diagrams 500A1, 500A2, 500A3, 500A4 of one or more IC devices including A6 cell, in accordance with some embodiments.

In FIG. 5A, A6 cell is an example of a cell having a plurality of IO patterns electrically coupled with each other and arranged along corresponding different tracks in a metal layer. For example, A6 cell comprises output patterns 501-504 in the M0 layer and correspondingly arranged along tracks M0_1, M0_2, M0_3, M0_4. The output patterns 501-504 are electrically coupled with each other so that data on the output patterns 501-504 are the same. As a result, each or any of the output patterns 501-504 is usable to route the output of A6 cell to a corresponding input of another cell. In some embodiments, some or all of the output patterns 501-504 are electrically coupled together by an extended MD contact structure, as described with respect to FIG. 1G. Other configurations for electrically coupling various IO patterns of a cell together are within the scopes of various embodiments. For example, in some embodiments, a conductive pattern in another metal layer and corresponding vias are included in the layout diagram of A6 cell to electrically couple some or all of the output patterns 501-504 together.

In the layout diagram 500A1, A6 cell is placed adjacent and routed to B6 cell. B6 cell comprises an input pattern 505 arranged along the track M0_1, and is to be routed to an output of A6 cell. As A6 cell is placed in abutment with B6 cell in a cell placement operation, the output pattern 501 of A6 cell is aligned with the input pattern 505 of B6 cell along the track M0_1. A connecting pattern 506 is routed in a routing operation between the aligned output pattern 501 of A6 cell and input pattern 505 of B6 cell.

In the layout diagram 500A2, A6 cell is placed adjacent and routed to C6 cell. C6 cell comprises an input pattern 507 arranged along the track M0_2, and is to be routed to an output of A6 cell. As A6 cell is placed in abutment with C6 cell in a cell placement operation, the output pattern 502 of A6 cell is aligned with the input pattern 507 of C6 cell along the track M0_2. A connecting pattern 508 is routed in a routing operation between the aligned output pattern 502 of A6 cell and input pattern 507 of C6 cell.

In the layout diagram 500A3, A6 cell is placed adjacent and routed to D6 cell. D6 cell comprises an input pattern 509 arranged along the track M0_3, and is to be routed to an output of A6 cell. As A6 cell is placed in abutment with D6 cell in a cell placement operation, the output pattern 503 of A6 cell is aligned with the input pattern 509 of D6 cell along the track M0_3. A connecting pattern 510 is routed in a routing operation between the aligned output pattern 503 of A6 cell and input pattern 509 of D6 cell.

In the layout diagram 500A4, A6 cell is placed adjacent and routed to E6 cell. E6 cell comprises an input pattern 511 arranged along the track M0_4, and is to be routed to an output of A6 cell. As A6 cell is placed in abutment with E6 cell in a cell placement operation, the output pattern 504 of A6 cell is aligned with the input pattern 511 of E6 cell along the track M0_4. A connecting pattern 512 is routed in a routing operation between the aligned output pattern 504 of A6 cell and input pattern 511 of E6 cell.

In some embodiments, by using a cell having multiple IO patterns electrically connected together and arranged in different tracks, it is possible to arrange one of the multiple IO patterns of the cell in alignment with a corresponding IO pattern of another cell, simply by placing the cells adjacent each other. In situations where one or both of the aligned IO patterns are on the wrong side(s), i.e., on a side not facing the other cell, an APR tool performs one or more horizontal flips as described herein to rearrange the aligned IO patterns to the correct sides, before routing a connecting pattern in the same metal layer between the aligned IO patterns. As a result, in at least one embodiment, connectivity, flexibility and/or likelihood of APR success by utilizing conductive patterns in an IO pattern containing metal layer is/are increased. In at least one embodiment, one or more advantages described herein are also achievable.

Figure 5B:
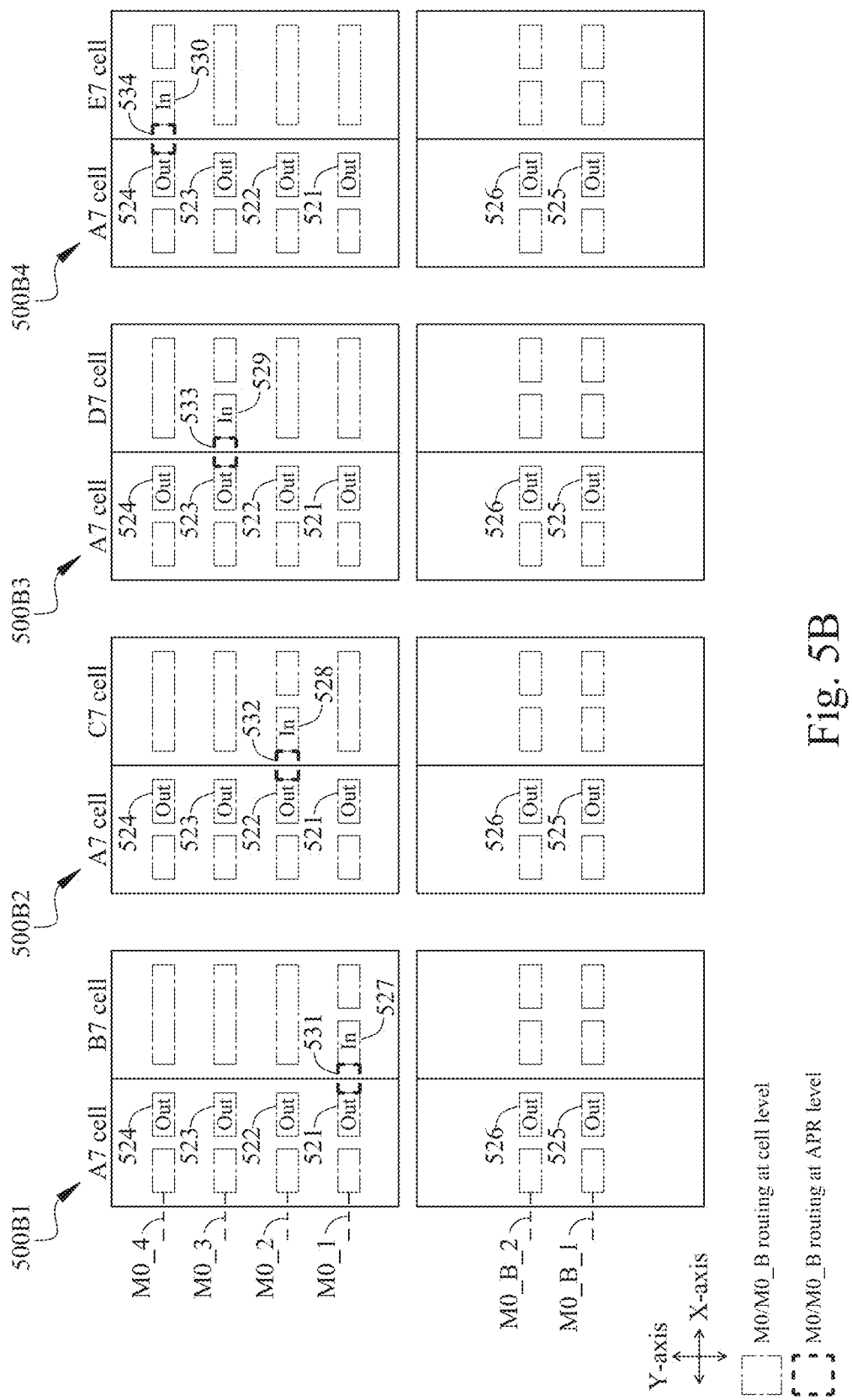
Figure 5C:
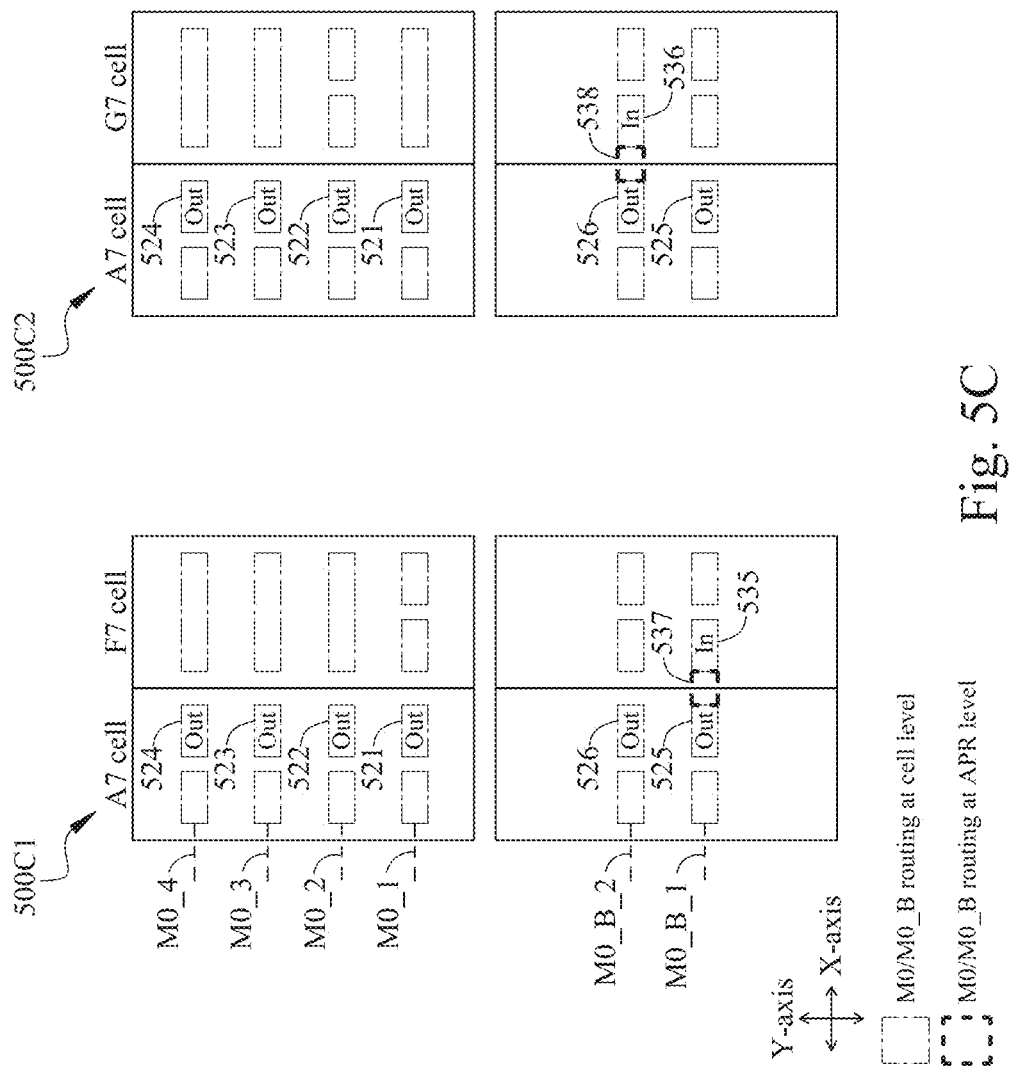

FIGS. 5B, 5C include schematic views of various layout diagrams 500B1-500B4, 500C1-500C2 of one or more IC devices including A7 cell, in accordance with some embodiments. The layout diagrams 500B1-500B4 in FIG. 5B include routing in the M0 layer. The layout diagrams 500C1-500C2 in FIG. 5C include routing in the M0_B layer.

A7 cell in FIGS. 5B-5C is another example of a cell having a plurality of IO patterns electrically coupled with each other and arranged along corresponding different tracks. A difference between A6 cell in FIG. 5A and A7 cell in FIGS. 5B-5C is that the electrically coupled IO patterns of A7 cell are arranged in both a front side metal layer and a back side metal layer. For example, A7 cell comprises output patterns 521-524 in the M0 layer and correspondingly arranged along tracks M0_1, M0_2, M0_3, M0_4. A7 cell further comprises output patterns 525-526 in the M0_B layer and correspondingly arranged along tracks M0_B_1, M0_B_2. The output patterns 521-526 are electrically coupled with each other so that data on the output patterns 521-526 are the same. As a result, each or any of the output patterns 521-526 is usable to route the output of A7 cell to a corresponding input of another cell. In some embodiments, some or all of the output patterns 521-526 are electrically coupled together by an extended MD contact structure, as described with respect to FIG. 1G. Other configurations for electrically coupling various IO patterns of a cell together are within the scopes of various embodiments.

In layout diagrams 500B1-500B4 in FIG. 5B, A7 cell is correspondingly placed adjacent and routed to B7-E7 cells. B7-E7 cells comprise corresponding input patterns 527-530 which are arranged in the M0 layer correspondingly along tracks M0_1, M0_2, M0_3, M0_4, and are each to be routed to an output of A7 cell. As A7 cell is placed in abutment with one of B7-E7 cells in a cell placement operation, a corresponding output pattern among the output patterns 521-524 of A7 cell is aligned with a corresponding input pattern among the input patterns 527-530 of B7-E7 cells along a corresponding track among the tracks M0_1, M0_2, M0_3, M0_4. Connecting patterns 531-534 are routed in a routing operation between the aligned output patterns 521-524 of A7 cell and corresponding input patterns 527-530 of B7-E7 cells.

In layout diagrams 500C1-500C2 in FIG. 5C, A7 cell is correspondingly placed adjacent and routed to F7-G7 cells. F7-G7 cells comprise corresponding input patterns 535-536 which are arranged in the M0_B layer correspondingly along tracks M0_B_1, M0_B_2, and are each to be routed to an output of A7 cell. As A7 cell is placed in abutment with one of F7-G7 cells in a cell placement operation, a corresponding output pattern among the output patterns 525-526 of A7 cell is aligned with a corresponding input pattern among the input patterns 535-536 of F7-G7 cells along a corresponding track among the tracks M0_B_1, M0_B_2. Connecting patterns 537-538 are routed in a routing operation between the aligned output patterns 525-526 of A7 cell and corresponding input patterns 535-536 of F7-G7 cells. In at least one embodiment, one or more advantages described herein with respect to one or more of the layout diagram(s) in FIGS. 3B, 5A are achievable by one or more of the layout diagram(s) in FIGS. 5B-5C.

Figure 5D:
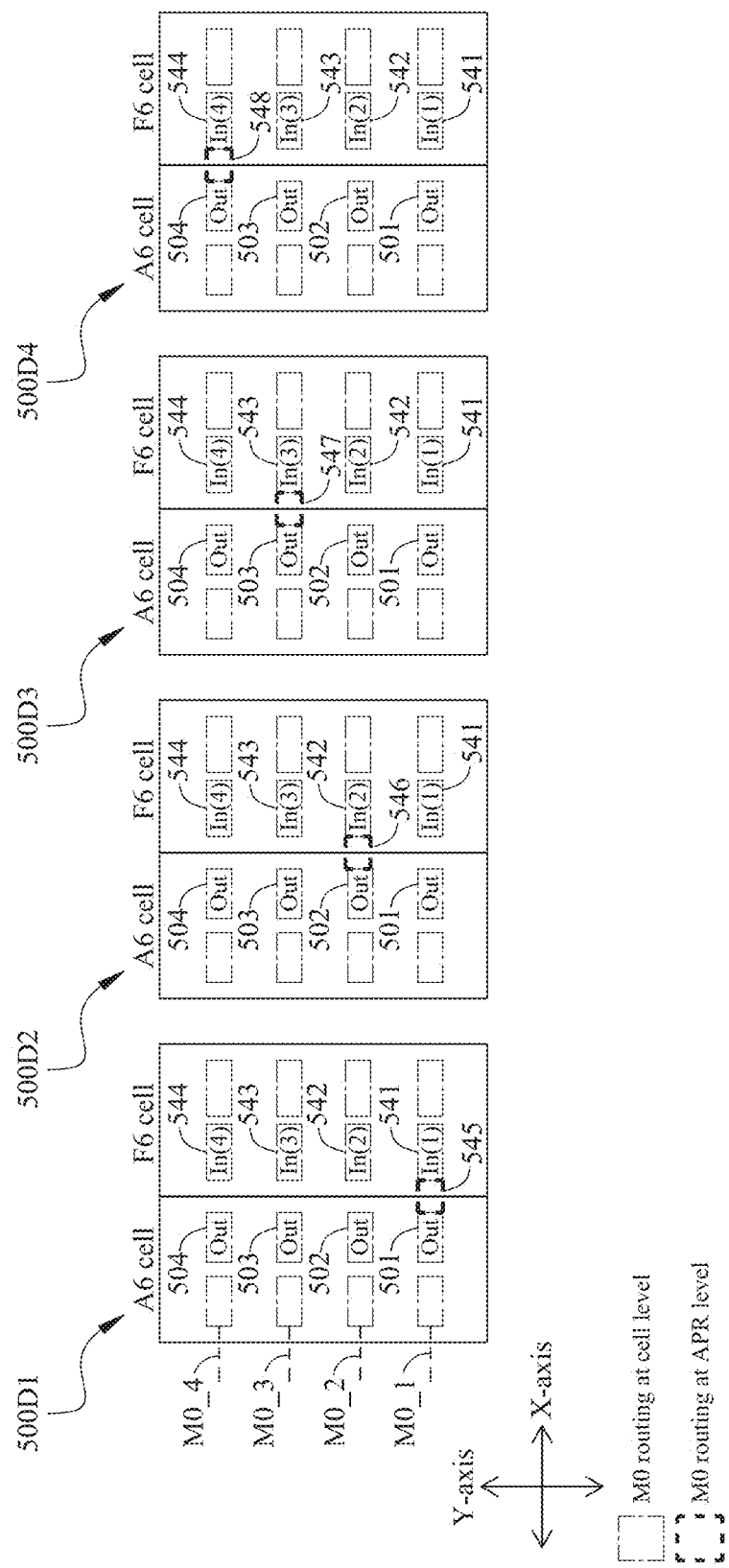

FIG. 5D includes schematic views of various layout diagrams 500D1-500D4 of one or more IC devices including A6 cell and F6 cell, in accordance with some embodiments.

A6 cell is described with respect to FIG. 5A. F6 cell, similarly to D3 cell described with respect to FIG. 4C, has multiple IO patterns which are swappable with each other. For example, F6 cell comprises input patterns 541-544 corresponding to four different inputs In(1), In(2), In(3), In(4) for the internal circuitry of F6 cell. The inputs In(1), In(2), In(3), In(4) are swappable with each other when it is possible to swap data supplied to the inputs In(1), In(2), In(3), In(4) without changing a function configured to be performed by F6 cell. In an example, F6 cell is a four-input AND gate. Other cell configurations with swappable IO patterns are within the scopes of various embodiments. For example, in one or more embodiments, all inputs In(1), In(2), In(3), In(4) are not swappable with each other, e.g., inputs In(1), In(2) are swappable with each other but not with inputs In(3), In(4), whereas inputs In(3), In(4) are swappable with each other but not with inputs In(1), In(2).

In an APR operation, as A6 cell is placed in abutment with F6 cell, the output patterns 501-504 of A6 cell are correspondingly aligned with the input patterns 541-544 corresponding to the inputs In(1), In(2), In(3), In(4) of F6 cell. When the inputs In(1), In(2), In(3), In(4) are swappable, the APR tool has multiple options for routing any of connecting patterns 545-548 between a corresponding output pattern among the output patterns 501-504 of A6 cell and a corresponding input pattern among the input patterns 541-544 of the F6 cell, resulting in a corresponding layout diagram among the layout diagrams 500D1-500D4. One of the routing options (i.e., one of the layout diagrams 500D1-500D4) is sufficient to route A6 cell to F6 cell. In at least one embodiment, the APR tool selects one of the options to route A6 cell to F6 cell based on one or more predetermined criteria. For example, the APR tool determines from an IC schematic that an output of A6 cell is to be routed to the input In(1) of F6 cell, and first attempts to route A6 cell to F6 cell in accordance with the layout diagram 500D1. When the routing option in accordance with the layout diagram 500D1 is not available or does not satisfy a design rule, the APR tool attempts the next routing option in accordance with the layout diagram 500D2, and so on. The availability of multiple options for routing between two cells as described with respect to FIG. 5D increases the flexibility and/or likelihood of APR success, in one or more embodiments. In at least one embodiment, one or more advantages described herein are also achievable by one or more of the layout diagram(s) in FIG. 5D.

Figure 5E:
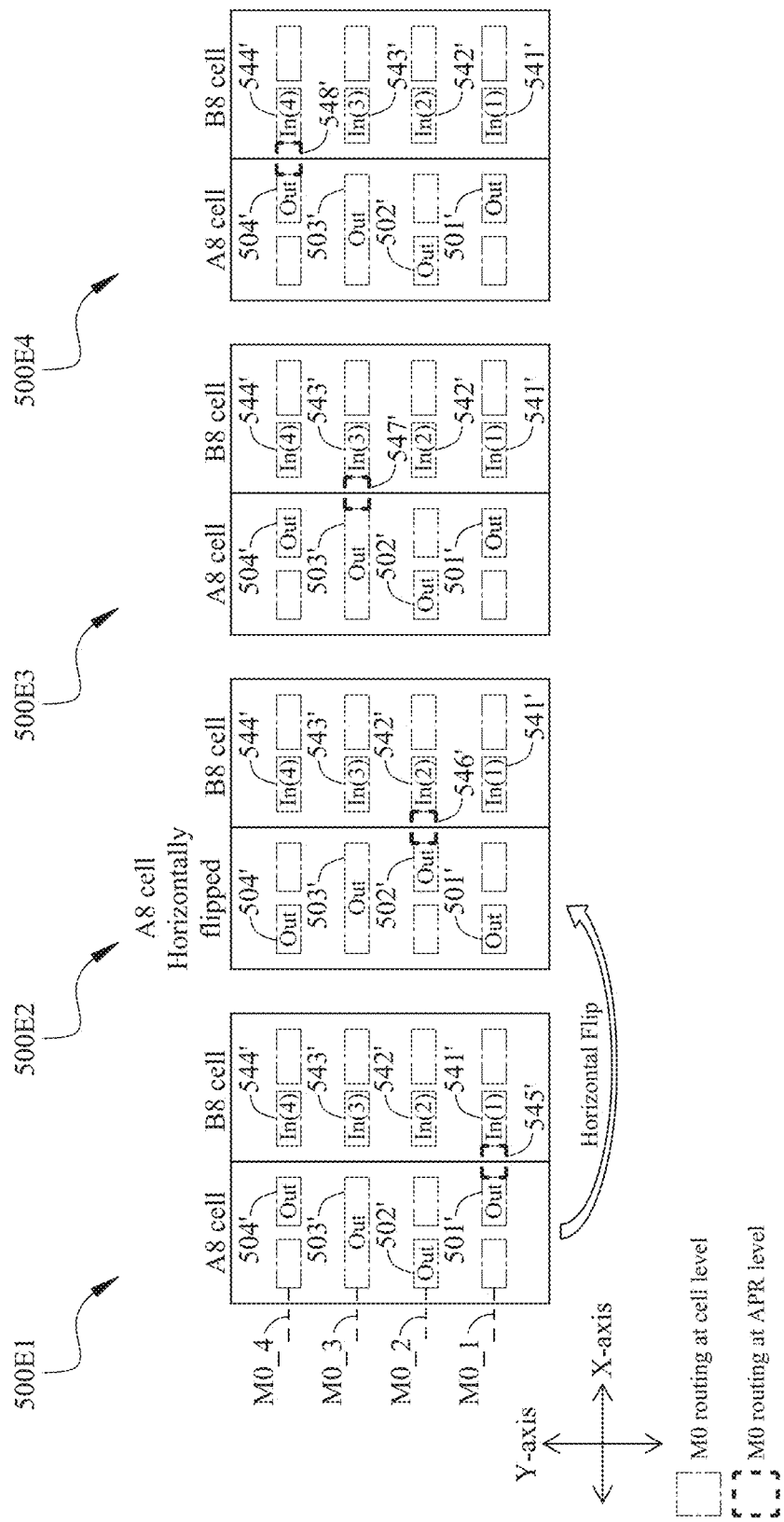

FIG. 5E includes schematic views of various layout diagrams 500E1-500E4 of one or more IC devices including A8 cell and B8 cell, in accordance with some embodiments. For simplicity, a component in FIG. 5E is indicated by the same reference numeral of the corresponding component in FIG. 5D but with the prime symbol.

B8 cell in FIG. 5E is similar to F6 cell in FIG. 5D and has input patterns 541'-544' corresponding to swappable inputs In(1), In(2), In(3), In(4). A8 cell in FIG. 5E is similar to A6 cell in FIG. 5D and has output patterns 501'-504' in the M0 layer, correspondingly arranged along tracks M0_1, M0_2, M0_3, M0_4, and electrically coupled with each other. A difference between A6 cell and A8 cell is that the output patterns 501'-504' of A8 cell are accessible for routing from different sides of A8 cell. For example, the output patterns 501', 504' are accessible for routing from the right side but not from the left side, the output pattern 502' is accessible for routing from the left side but not from the right side, the output pattern 503' is accessible for routing from both the left side and the right side. Due to the different accessibility of the output patterns 501'-504' of A8 cell, there is a situation where a simple placement of A8 cell in abutment with B8 cell results in an output pattern, e.g., 502', of A8 cell is on the wrong side of A8 cell with respect to the corresponding input pattern, e.g., 542', of B8 cell, as best seen in the layout diagram 500E1. In such a situation, when the APR tool attempts to route the output pattern 502' of A8 cell to the corresponding input pattern 542' of B8 cell, and the APR tool performs a horizontal flip before placing A8 cell in abutment with B8 cell. As a result, the output pattern 502' is rearranged to the right side, i.e., the side that faces the corresponding input pattern 542', and is routed to the input pattern 542' by a connecting pattern 546', resulting in the layout diagram 500E2. In at least one embodiment, one or more advantages described with respect to FIG. 5D are also achievable by one or more of the layout diagram(s) in FIG. 5E.

Figure 5F:
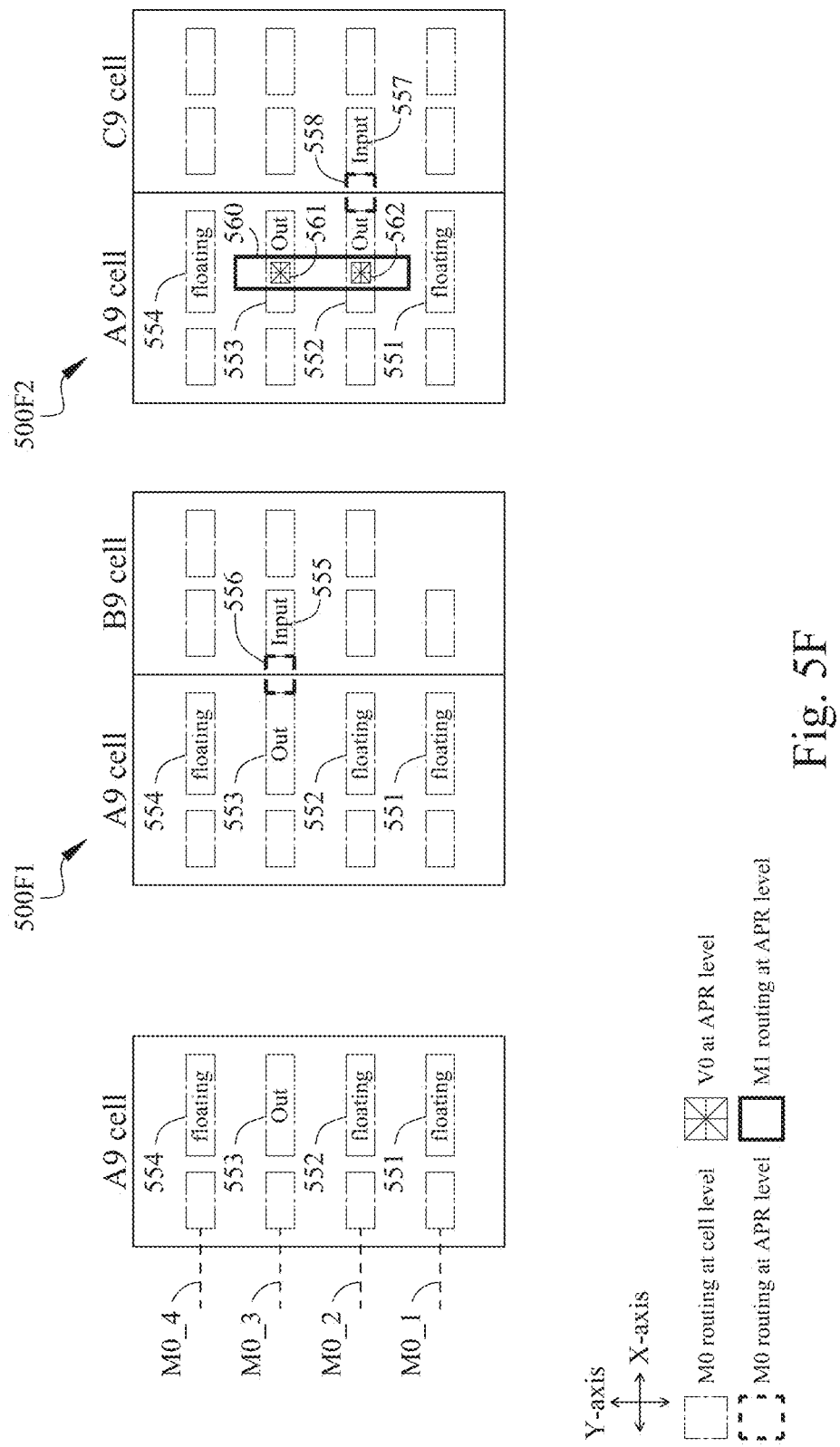

FIG. 5F includes a schematic view of a layout diagram of A9 cell, and schematic views of layout diagrams 500F1, 500F2 of one or more IC devices including A9 cell, in accordance with some embodiments.

In FIG. 5F, A9 cell is an example of a cell having a plurality of conductive patterns along corresponding different tracks in a metal layer, wherein each of the conductive patterns is an IO pattern or a floating conductive pattern. For example, A9 cell comprises M0 conductive patterns 551-554 in the M0 layer and correspondingly arranged along tracks M0_1, M0_2, M0_3, M0_4. The M0 conductive patterns 551, 552, 554 are floating conductive patterns, whereas the M0 conductive pattern 553 is an output pattern of A9 cell. An example of A9 cell is described with respect to FIG. 1B, which shows an inverter cell with an output pattern 141 and two floating conductive patterns 143, 144 along different tracks. Other cell configurations are within the scopes of various embodiments. In at least one embodiment, each of the floating conductive patterns 551, 552, 554 is configurable as an output pattern in an APR operation, as described herein.

In the layout diagram 500F1, A9 cell is placed adjacent and routed to B9 cell. B9 cell comprises an input pattern 555 arranged along the track M0_3, and is to be routed to an output of A9 cell. As A9 cell is placed in abutment with B9 cell in a cell placement operation, the output pattern 553 of A9 cell is aligned with the input pattern 555 of B9 cell along the track M0_3. A connecting pattern 556 is routed in a routing operation between the aligned output pattern 553 of A9 cell and input pattern 555 of B9 cell.

In the layout diagram 500F2, A9 cell is placed adjacent and routed to C9 cell. C9 cell comprises an input pattern 557 arranged along the track M0_2, and is to be routed to an output of A9 cell. As A9 cell is placed in abutment with C9 cell in a cell placement operation, the output pattern 553 of A9 cell is in a different track M0_3 and is not aligned with the input pattern 557 of C9 cell which is along the track M0_2. Upon determining that the output pattern 553 and input pattern 557 are not aligned along the same track, the APR tool performs routing to convert the floating conductive pattern 552, which is along the same track M0_2 as the input pattern 557, into a new output pattern of A9 cell.

For this conversion, in the example configuration in FIG. 5F, the APR tool generates a conductive pattern 560 in a different metal layer, e.g., the M1 layer, and corresponding vias, e.g., V0 vias, 561, 562. The M1 conductive pattern 560 is an example of M1 conductive patterns added or routed by an APR tool in a routing operation. Such M1 conductive patterns are schematically designated in the drawings as "M1 routing at APR level." The V0 vias 561, 562 are examples of V0 vias added or routed by an APR tool in a routing operation. Such V0 vias are schematically designated in the drawings as "V0 at APR level." The M1 conductive pattern 560 extends along the Y-axis, and overlaps both the output pattern 553 and the floating conductive pattern 552 to be converted into a new output pattern. The V0 via 561 is arranged between and electrically couples the output pattern 553 to the M1 conductive pattern 560, whereas the V0 via 562 is arranged between and electrically couples the M1 conductive pattern 560 to the conductive pattern 552. As a result, the conductive pattern 552 is no longer a floating conductive pattern and becomes a new output pattern of A9 cell. A connecting pattern 558 is routed in the M0 layer in a routing operation between the aligned new output pattern 552 of A9 cell and input pattern 557 of C9 cell.

The described conversion of a floating conductive pattern into a new IO pattern is also applicable to back side metal layers. For example, in one or more embodiments, a floating conductive pattern and an IO pattern in the M0_B layer are electrically coupled with each other in an APR operation through a conductive pattern in the M1_B layer and corresponding V0_B vias between the M0_B layer and the M1_B layer. In at least one embodiment, by providing one or more floating conductive patterns in different tracks and converting at least one of the floating conductive patterns into an IO pattern as necessary, the flexibility and/or likelihood of APR success are increased. In at least one embodiment, one or more advantages described herein are also achievable by one or more of the layout diagram(s) in FIG. 5F.

Figure 5G:
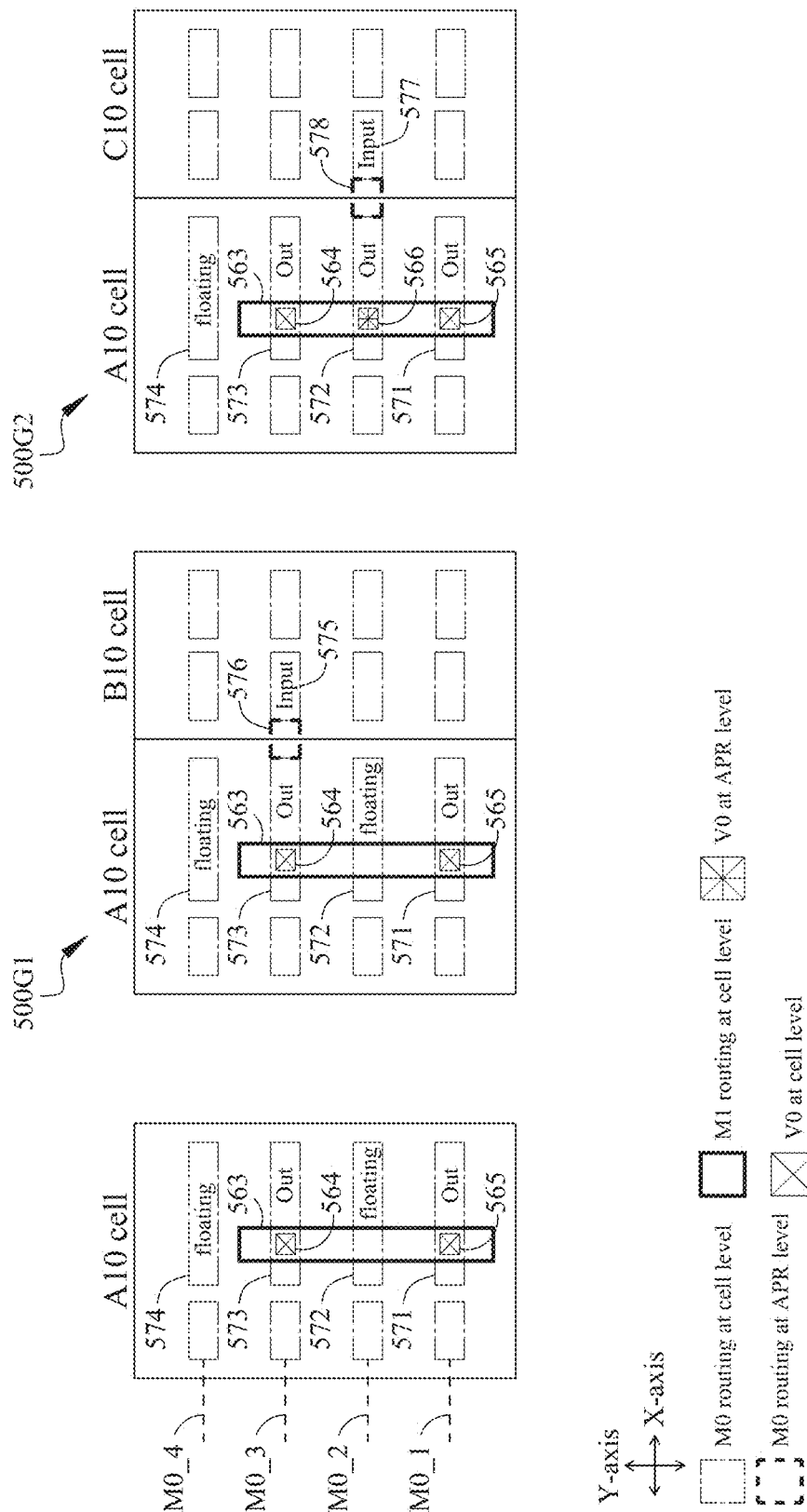

FIG. 5G includes a schematic view of a layout diagram of A10 cell, and schematic views of layout diagrams 500G1, 500G2 of one or more IC devices including A10 cell, in accordance with some embodiments.

A10 cell, like A9 cell, is a further example of a cell having a plurality of conductive patterns along corresponding different tracks in a metal layer, wherein each of the conductive patterns is an IO pattern or a floating conductive pattern. However, a difference different between A9 cell and A10 cell is that A10 cell already includes an M1 conductive pattern 563 and corresponding V0 vias 564, 565 which together electrically couple several IO patterns of A10 cell. The M1 conductive pattern 563 can be used in an APR operation to convert a floating conductive pattern into a new IO pattern, as described herein.

Specifically, A10 cell comprises M0 conductive patterns 571-574 in the M0 layer and correspondingly arranged along tracks M0_1, M0_2, M0_3, M0_4. The M0 conductive patterns 572, 574 are floating conductive patterns, whereas the M0 conductive patterns 571, 573 are output patterns of A10 cell. The M1 conductive pattern 563, which is already included in the layout diagram of A10 cell, extends along the Y-axis, and overlaps both the output patterns 571, 573. The V0 via 564 is arranged between and electrically couples the output pattern 573 to the M1 conductive pattern 563, whereas the V0 via 565 is arranged between and electrically couples the M1 conductive pattern 563 to the output pattern 571. As a result, the output patterns 571, 573 are electrically coupled together. In some embodiments, the M1 conductive pattern 563 also overlaps the floating conductive pattern 574, so as to convert the floating conductive pattern 574 into a new output pattern when necessary. The M1 conductive pattern 563 is an example of M1 conductive patterns already included in a cell. Such M1 conductive patterns are schematically designated in the drawings as "M1 routing at cell level." The V0 vias 564, 565 are examples of V0 vias already included in a cell. Such V0 vias are schematically designated in the drawings as "V0 at cell level."

In the layout diagram 500G1, A10 cell is placed adjacent and routed to B10 cell. B10 cell comprises an input pattern 575 arranged along the track M0_3, and is to be routed to an output of A10 cell. As A10 cell is placed in abutment with B10 cell in a cell placement operation, the output pattern 573 of A10 cell is aligned with the input pattern 575 of B10 cell along the track M0_3. A connecting pattern 576 is routed in a routing operation between the aligned output pattern 573 of A10 cell and input pattern 575 of B10 cell.

In the layout diagram 500G2, A10 cell is placed adjacent and routed to C10 cell. C10 cell comprises an input pattern 577 arranged along the track M0_2, and is to be routed to an output of A10 cell. As A10 cell is placed in abutment with C10 cell in a cell placement operation, the output patterns 571, 573 of A10 cell are in different tracks M_1, M0_3 and are not aligned with the input pattern 577 of C10 cell which is along the track M0_2. Upon determining that the output patterns 571, 573 and input pattern 577 are not aligned along the same track, the APR tool performs routing to convert the floating conductive pattern 572, which is along the same track M0_2 as the input pattern 577, into a new output pattern of A10 cell. For this conversion, in the example configuration in FIG. 5G, the APR tool generates a V0 via 566 between and electrically coupling the M1 conductive pattern 563 and the conductive pattern 572. As a result, the conductive pattern 572 is electrically coupled to the output patterns 571, 573 through the M1 conductive pattern 563 and the corresponding V0 vias 564-566, and becomes a new output pattern of A10 cell. A connecting pattern 578 is routed in the M0 layer in a routing operation between the aligned new output pattern 572 of A10 cell and input pattern 577 of C10 cell.

The described arrangement of an M1 conductive pattern at the cell level is also applicable to back side metal layers, e.g., an M1_B conductive pattern and corresponding V0_B vias are included in a layout diagram of a cell in a manner similar to M1 conductive pattern 563 and V0 vias 564, 565 in A10 cell. In at least one embodiment, one or more advantages described herein with respect to one or more layout diagrams in FIG. 5F are also achievable by one or more of the layout diagram(s) in FIG. 5G. Further, because an M1 conductive pattern is already included at the cell level, additional M1 routing resources are not required at the APR level, in one or more embodiments.

Figure 5H:
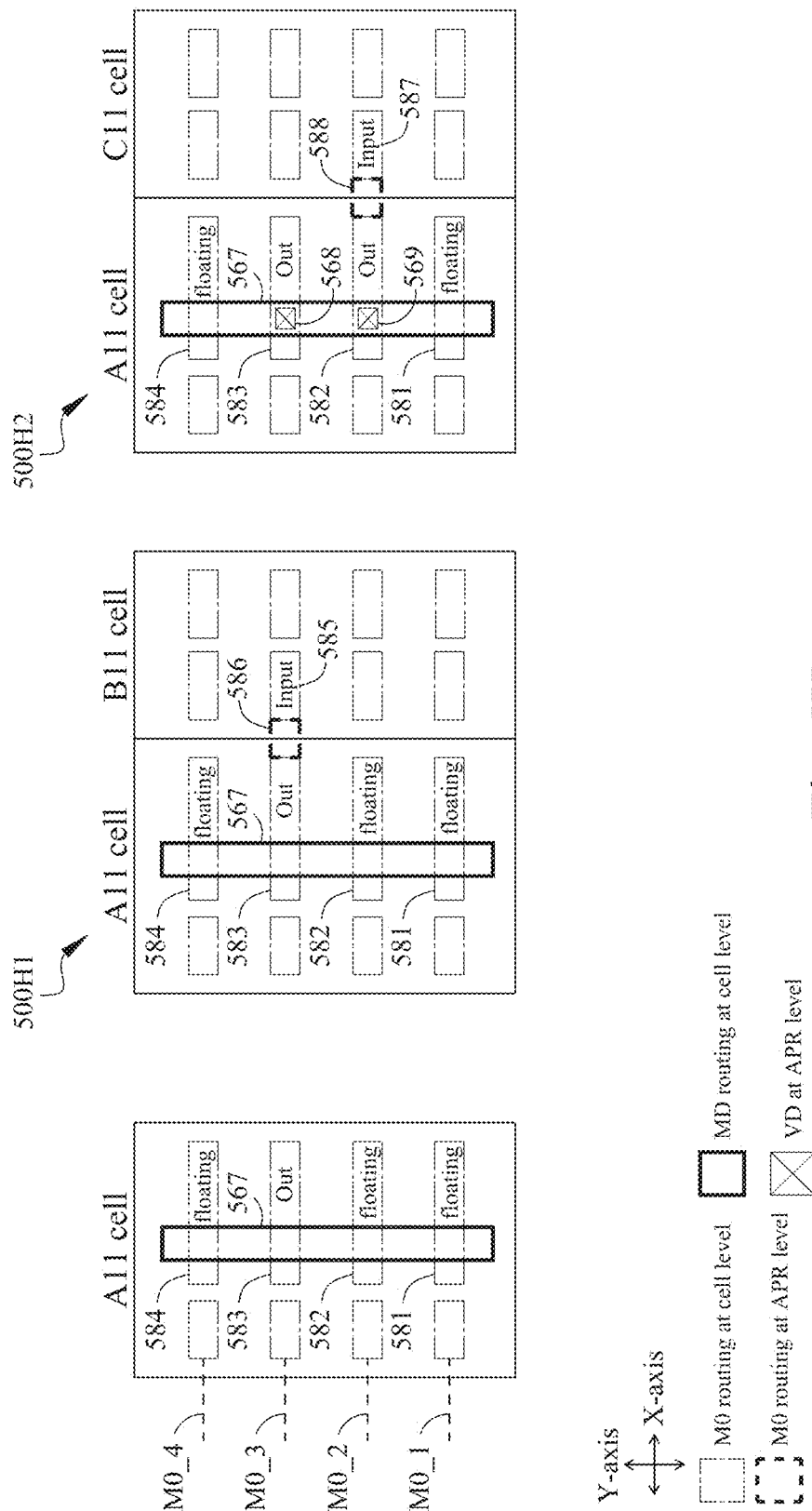
Figure 51:
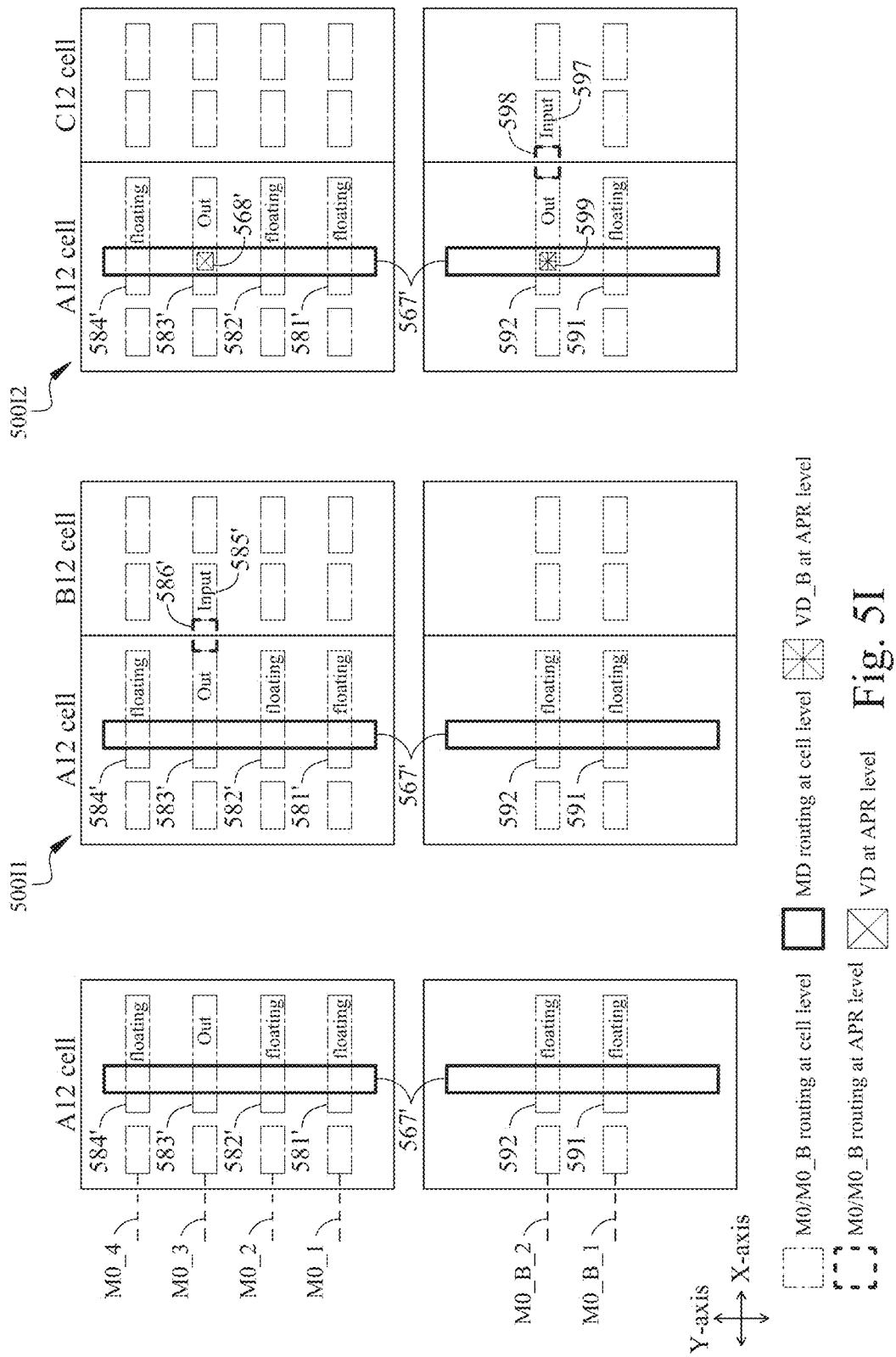

FIG. 5H includes a schematic view of a layout diagram of A11 cell, and schematic views of layout diagrams 500H1, 500H2 of one or more IC devices including A11 cell, in accordance with some embodiments.

A11 cell is similar to A9 cell, with the addition of an extended MD contact structure for convert a floating conductive pattern into a new IO pattern, as described herein. Specifically, A11 cell comprises M0 conductive patterns 581-584 in the M0 layer and correspondingly arranged along tracks M0_1, M0_2, M0_3, M0_4. The M0 conductive patterns 581, 582, 584 are floating conductive patterns, whereas the M0 conductive pattern 583 is an output pattern of A11 cell. An extended MD contact structure 567, which is already included in the layout diagram of A11 cell, extends along the Y-axis, and overlaps the M0 conductive patterns 581-584. MD contact structures already included in a cell are schematically designated in the drawings as "MD routing at cell level."

In the layout diagram 500H1, A11 cell is placed adjacent and routed to B11 cell. B11 cell comprises an input pattern 585 arranged along the track M0_3, and is to be routed to an output of A11 cell. As A11 cell is placed in abutment with B11 cell in a cell placement operation, the output pattern 583 of A11 cell is aligned with the input pattern 585 of B11 cell along the track M0_3. A connecting pattern 586 is routed in a routing operation between the aligned output pattern 583 of A11 cell and input pattern 585 of B11 cell.

In the layout diagram 500H2, A11 cell is placed adjacent and routed to C11 cell. C11 cell comprises an input pattern 587 arranged along the track M0_2, and is to be routed to an output of A11 cell. As A11 cell is placed in abutment with C11 cell in a cell placement operation, the output pattern 583 of A11 cell is in a different track M0_3 and is not aligned with the input pattern 587 of C11 cell which is along the track M0_2. Upon determining that the output pattern 583 and input pattern 587 are not aligned along the same track, the APR tool performs routing to convert the floating conductive pattern 582, which is along the same track M0_2 as the input pattern 587, into a new output pattern of A11 cell. For this conversion, in the example configuration in FIG. 5H, the APR tool generates a VD via 568 between and electrically coupling the extended MD contact structure 567 and the output pattern 583, and another VD via 569 between and electrically coupling the extended MD contact structure 567 and the conductive pattern 582. As a result, the conductive pattern 582 is electrically coupled to the output pattern 583 through the extended MD contact structure 567 and the corresponding VD vias 568-569, and becomes a new output pattern of A11 cell. VD vias 568-569 added or routed by an APR tool in a routing operation are schematically designated in the drawings as "VD at APR level." A connecting pattern 588 is routed in the M0 layer in a routing operation between the aligned new output pattern 582 of A11 cell and input pattern 587 of C11 cell. In at least one embodiment, one or more advantages described herein with respect to one or more layout diagrams in FIGS. 5G-5F are also achievable by one or more of the layout diagram(s) in FIG. 5H.

FIG. 5I includes a schematic view of a layout diagram of A12 cell, and schematic views of layout diagrams 500I1, 500I2 of one or more IC devices including A12 cell, in accordance with some embodiments. For simplicity, a component in FIG. 5I is indicated by the same reference numeral of the corresponding component in FIG. 5H but with the prime symbol.

A12 cell is similar to A11 cell, with the addition of a back side metal layer. Specifically, A12 cell comprises M0 conductive patterns 581'-584' in the M0 layer and correspondingly arranged along tracks M0_1, M0_2, M0_3, M0_4. The M0 conductive patterns 581', 582', 584' are floating conductive patterns, whereas the M0 conductive pattern 583' is an output pattern of A12 cell. An extended MD contact structure 567', which is already included in the layout diagram of A12 cell, extends along the Y-axis, and overlaps the M0 conductive patterns 581'-584'. A12 cell further comprises floating conductive patterns 591, 592 in the M0_B layer and correspondingly arranged along tracks M0_B_1, M0_B_2. The same extended MD contact structure 567' is shown in both the upper part of A12 cell corresponding to the M0 layer and in the lower part of A12 cell corresponding to the M0_B layer.

In the layout diagram 500I1, A12 cell is placed adjacent and routed to B12 cell. B12 cell comprises an input pattern 585' arranged along the track M0_3, and is to be routed to an output of A12 cell. As A12 cell is placed in abutment with B12 cell in a cell placement operation, the output pattern 583' of A12 cell is aligned with the input pattern 585' of B12 cell along the track M0_3. A connecting pattern 586' is routed in a routing operation between the aligned output pattern 583' of A12 cell and input pattern 585' of B12 cell.

In the layout diagram 500I2, A12 cell is placed adjacent and routed to C12 cell. C12 cell comprises an input pattern 597 arranged along the track M0_B_2, and is to be routed to an output of A12 cell. As A12 cell is placed in abutment with C12 cell in a cell placement operation, the output pattern 583' of A12 cell is in a different track of a different metal layer and is not aligned with the input pattern 597 of C12 cell. Upon determining that the output pattern 583' and input pattern 597 are not aligned along the same track, the APR tool performs routing to convert the floating conductive pattern 592, which is along the same track M0_B_2 as the input pattern 597, into a new output pattern of A12 cell. For this conversion, in the example configuration in FIG. 5I, the APR tool generates a VD via 568' between and electrically coupling the extended MD contact structure 567' and the output pattern 583', and a VD_B via 599 between and electrically coupling the active region(s) under the extended MD contact structure 567' and the conductive pattern 592. As a result, the conductive pattern 592 is electrically coupled to the output pattern 583' through the active region(s), the extended MD contact structure 567', the VD via 568' and the VD_B via 599, and becomes a new output pattern of A12 cell. The VD_B via 599 added or routed by an APR tool in a routing operation is schematically designated in the drawings as "VD_B at APR level." A connecting pattern 598 is routed in the M0_B layer in a routing operation between the aligned new output pattern 592 of A12 cell and input pattern 597 of C12 cell. In at least one embodiment, one or more advantages described herein with respect to one or more layout diagrams in FIGS. 5G-5H are also achievable by one or more of the layout diagram(s) in FIG. 5I.

Figure 6A:
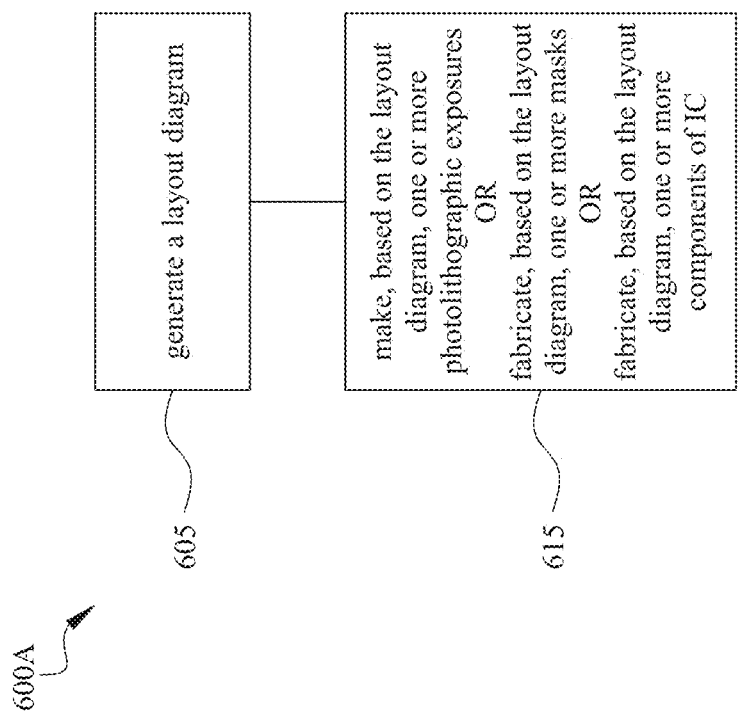
FIGS. 6A-6C are flowcharts of various methods, in accordance with some embodiments.

FIG. 6A is a flowchart of a method 600A of generating a layout diagram and using the layout diagram to manufacture an IC device, in accordance with some embodiments.

The method 600A is implementable, for example, using an EDA system as described herein and/or an integrated circuit (IC) manufacturing system as described herein, in accordance with some embodiments. Regarding the method 600A, examples of the layout diagram include the layout diagrams disclosed herein with respect to one or more of FIGS. 1B-1G, 3A-3B, 4C-4G, 5A-5I, or the like. Examples of an IC device to be manufactured according to the method 600A include the IC devices disclosed with respect to FIG. 2. The method 600A comprises operations 605, 615.

At operation 605, a layout diagram is generated which, among other things, include patterns represent one or more cells as described with respect to one or more of FIGS. 1B-1G, 3A-3B, 4C-4G, 5A-5I, or the like.

At operation 615, based on the layout diagram, at least one of (A) one or more photolithographic exposures are made or (B) one or more semiconductor masks are fabricated or (C) one or more components in a layer of an IC device are fabricated.

Figure 6B:
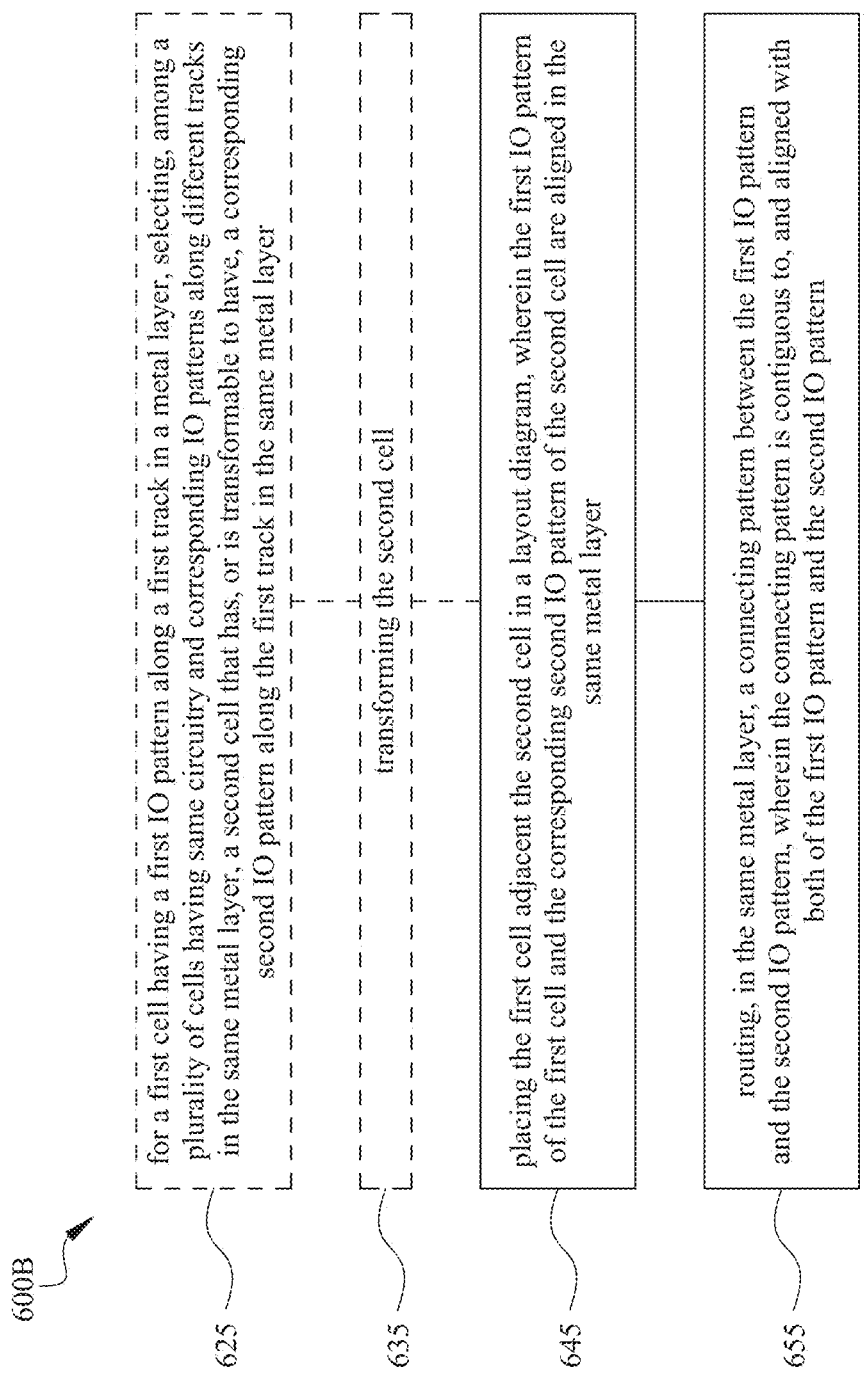

FIG. 6B is a flowchart of a method 600B of generating a layout diagram, in accordance with some embodiments. More particularly, the flowchart of FIG. 6B demonstrates one example of procedures implementable in operation 605 of FIG. 6A, in accordance with one or more embodiments.

In some embodiments, the method 600B is performed by an APR tool. The method 600B comprises operations 625, 635, 645, 655. In some embodiments, one or more of operations 625, 635 are omitted.

At operation 625, for a first cell having a first IO pattern along a first track in a metal layer, a second cell is selected among a plurality of cells having same circuitry and corresponding IO patterns along different tracks in the same metal layer. The selected second cell has, or is transformable to have, a corresponding second IO pattern along the first track in the same metal layer. For example, as described with respect to FIG. 4A, a plurality of cells 401-404 having the same circuitry and corresponding IO patterns 411-414 along different tracks M0_1, M0_2, M0_3, M0_4 in the M0 layer are included in a cell library. As described with respect to FIG. 4B, depending on the track (e.g., M0_2) along which a first IO pattern (e.g., 416) of the first cell (e.g., B3 cell) is arranged, a second cell (e.g., 402) that has the corresponding second IO pattern (e.g., 412) along the same track is selected. A further example of cell selection is described with respect to FIGS. 4E-4F.

In some embodiments, operation 625 is omitted. For example, a selection of a cell or a version of a cell as described with respect to FIGS. 4A-4B, 4E-4F is not performed in one or more embodiments, where IO patterns of cells are restricted to a certain track as described with respect to FIGS. 3A-3B, and/or where multiple IO patterns and/or floating conductive patterns which are convertible into IO patterns are included in a cell as described with respect to FIGS. 5A-5I.

At operation 635, the second cell is transformed, where necessary. In an example, a cell transformation is performed where the corresponding IO patterns of the first and second cells, although aligned along the same track in the same metal layer, are not arranged at facing edges of the first and second cells to be placed adjacent each other. Examples of cell transformation are described with respect to FIGS. 4D, 4G, 5E, and include, but are not limited to, a horizontal flip, an upside down flip, or the like.

In some embodiments, operation 635 is omitted. For example, a cell transformation as described with respect to FIGS. 4D, 4G, 5E is not performed in one or more embodiments, where the corresponding IO patterns of the first and second cells to be placed adjacent each other are already arranged at the facing edges of the first and second cells.

At operation 645, a cell placement operation is performed to place the first cell adjacent the second cell in a layout diagram, wherein the first IO pattern of the first cell and the corresponding second IO pattern of the second cell are aligned in the same metal layer. For example, as described with respect to FIG. 3A, the first cell (e.g., B1 cell) is placed adjacent the second cell (e.g., A1 cell), wherein the first IO pattern 312 of the first cell and the corresponding second IO pattern 311 of the second cell are aligned, e.g., along the track M0_2, in the same M0 layer. Further examples are described with respect to FIGS. 3B, 4B-4D, 4F, 5B-5I.

At operation 655, a routing operation is performed for routing, in the same metal layer, a connecting pattern between the first IO pattern and the second IO pattern, wherein the connecting pattern is contiguous to, and aligned with both of the first IO pattern and the second IO pattern. For example, as described with respect to FIG. 3A, a connecting pattern 315 is routed, in the M0 layer, between the first IO pattern 312 and the second IO pattern 311, wherein the connecting pattern 315 is contiguous to, and aligned with both of the first IO pattern 312 and the second IO pattern 311. Further examples are described with respect to FIGS. 3B, 4B-4D, 4F, 5B-5I. In some embodiments, the routing operation is performed to further convert a floating conductive pattern in a cell into an IO pattern of the cell, as described with respect to FIGS. 5F-5I.

Figure 6C:
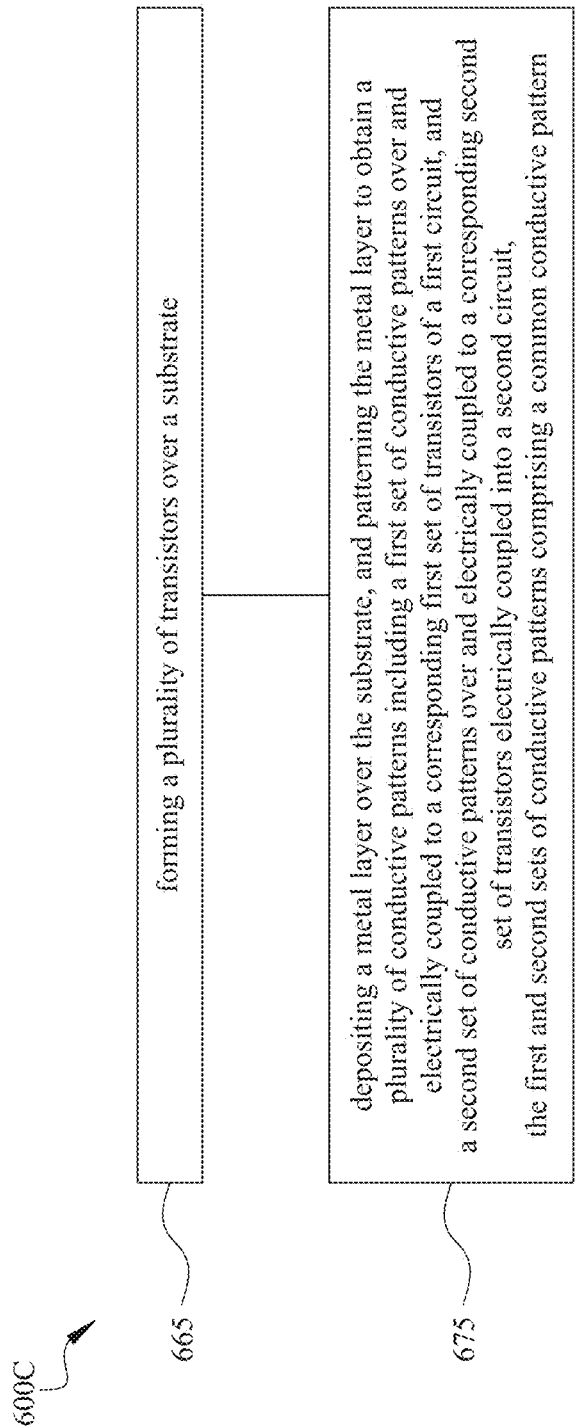

FIG. 6C is a flowchart of a method 600C of manufacturing an IC device in accordance with a layout diagram. More particularly, the flowchart of FIG. 6C demonstrates one example of procedures implementable in operation 615 of FIG. 6A, in accordance with one or more embodiments. The method 600C comprises operations 665, 675.

At operation 665, a plurality of transistors is formed over a substrate, e.g., the substrate 260 as described with respect to FIG. 2. The substrate comprises, in at least one embodiment, silicon, silicon germanium (SiGe), gallium arsenic, or other suitable semiconductor materials. In some embodiments, the substrate is an insulating substrate. Active regions are formed in or over the substrate, using one or more masks corresponding to one or more active regions in the layout diagrams described herein. In some embodiments, P-type dopants and/or N-type dopants are implanted into the substrate to form active regions. A gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, and the gate electrode layer is patterned into one or more gate electrodes, such as the gate portions 211-216 described with respect to FIG. 2. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or BF2, n-type dopants, such as phosphorus or arsenic, and/or combinations thereof. In the resulting structure, the gate electrodes and active regions form a plurality of transistors over the substrate, as described with respect to FIG. 2.

At operation 675, a metal layer is deposited over the substrate, and patterned to obtain a plurality of conductive patterns. In some embodiments, interconnect structures are deposited and patterned over gate electrodes and drain/source regions of the transistors. For example, as described with respect to FIG. 2, various MD contact structures, VD via structures, VG via structures, M0 conductive patterns, V0 via structures, M1 conductive patterns, or the like, are formed over the substrate. In an example manufacturing process, a conductive layer, e.g., a metal, is deposited over the substrate with the transistors formed thereon, thereby making electrical connections to the drain/source regions of the transistors. A planarizing process is performed to planarize the conductive layer, resulting in contact structures, such as the MD contact structures 231-234 described with respect to FIG. 2, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more via structures, such as the VD and VG via structures 241, 242 described with respect to FIG. 2. A planarizing process is performed. An M0 layer including a conductive material, such as a metal, is deposited over the planarized structure and patterned to form various M0 conductive patterns, such as the M0 conductive patterns 243, 244 described with respect to FIG. 2. In some embodiments, a dielectric layer is further deposited over the patterned M0 layer. The dielectric layer is etched, and the etched portions are filled with a conductive material, such as a metal, to form one or more V0 via structures 245, 246 of a V0 layer, as described with respect to FIG. 2. A planarizing process is then performed. An M1 layer including a conductive material, such as a metal, is deposited over the planarized structure obtained at the end of the formation of the V0 layer. The M1 layer is patterned to form various M1 conductive patterns 247, 248, as described with respect to FIG. 2. The process is repeated to form further metal layers and/or via layers. A similar process of forming interconnect structures is performed, in one or more embodiments, to form one or more backside metal layers and/or backside via layers, as described with respect to FIG. 2.

The M0 conductive pattern comprises a first set of conductive patterns over and electrically coupled to a corresponding first set of transistors among the plurality of transistors over the substrate. The first set of transistors is electrically coupled into a first circuit corresponding to a first cell in the layout diagram. For example, as described with respect to FIG. 3A, a first set of transistors (not shown in FIG. 3A) inside the boundary 301 is electrically coupled, by one or more of the described interconnect structures, into a first circuit corresponding to A1 cell. A first set of M0 conductive patterns is over the first set of transistors in the boundary 301, and is electrically coupled to the first set of transistors in the boundary 301, for example, as indicated by conductive patterns 311, 313.

The M0 conductive pattern further comprises a second set of conductive patterns over and electrically coupled to a corresponding second set of transistors among the plurality of transistors over the substrate. The second set of transistors is electrically coupled into a second circuit corresponding to a second cell in the layout diagram. For example, as described with respect to FIG. 3A, a second set of transistors (not shown in FIG. 3A) inside the boundary 302 is electrically coupled, by one or more of the described interconnect structures, into a second circuit corresponding to B1 cell. A second set of M0 conductive patterns is over the second set of transistors in the boundary 302, and is electrically coupled to the second set of transistors in the boundary 302, for example, as indicated by conductive patterns 312, 314.

The first and second sets of conductive patterns comprise a common conductive pattern. For example, in the manufactured IC device and as shown in FIG. 3A, the conductive pattern 311 in the first set and the conductive pattern 312 in the second set are integral parts of a single conductive pattern that extends continuously along the X-axis and includes the conductive patterns 311, 312 and 315. Such a single conductive pattern is considered as a common conductive pattern to both the first and second sets of conductive patterns. Similar processes and/or structures are applicable to a backside metal layer, e.g., M0_B. In at least one embodiment, one or more advantages described herein are achievable by the IC device manufactured by the method 600C.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, some or all of the methods discussed above are performed by an IC layout diagram generation system. In some embodiments, an IC layout diagram generation system is usable as part of a design house of an IC manufacturing system discussed below.

Figure 7:
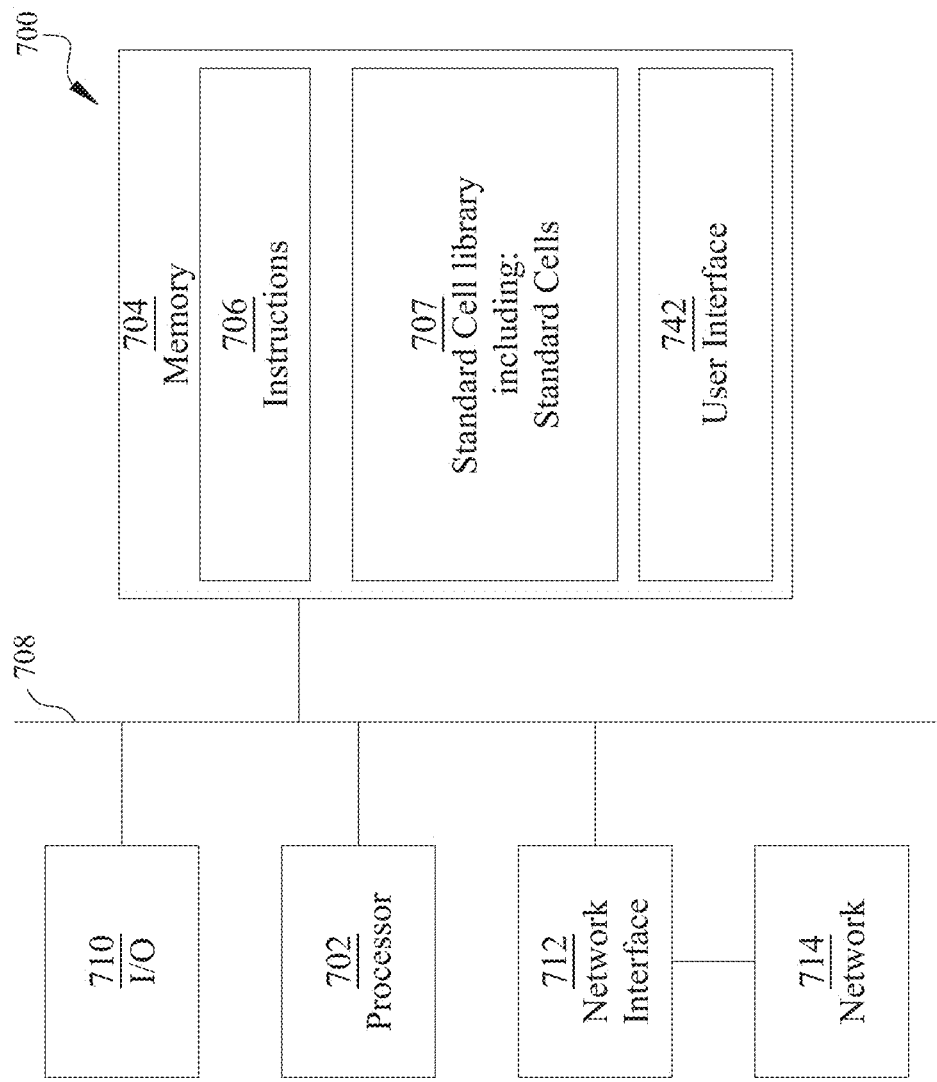
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
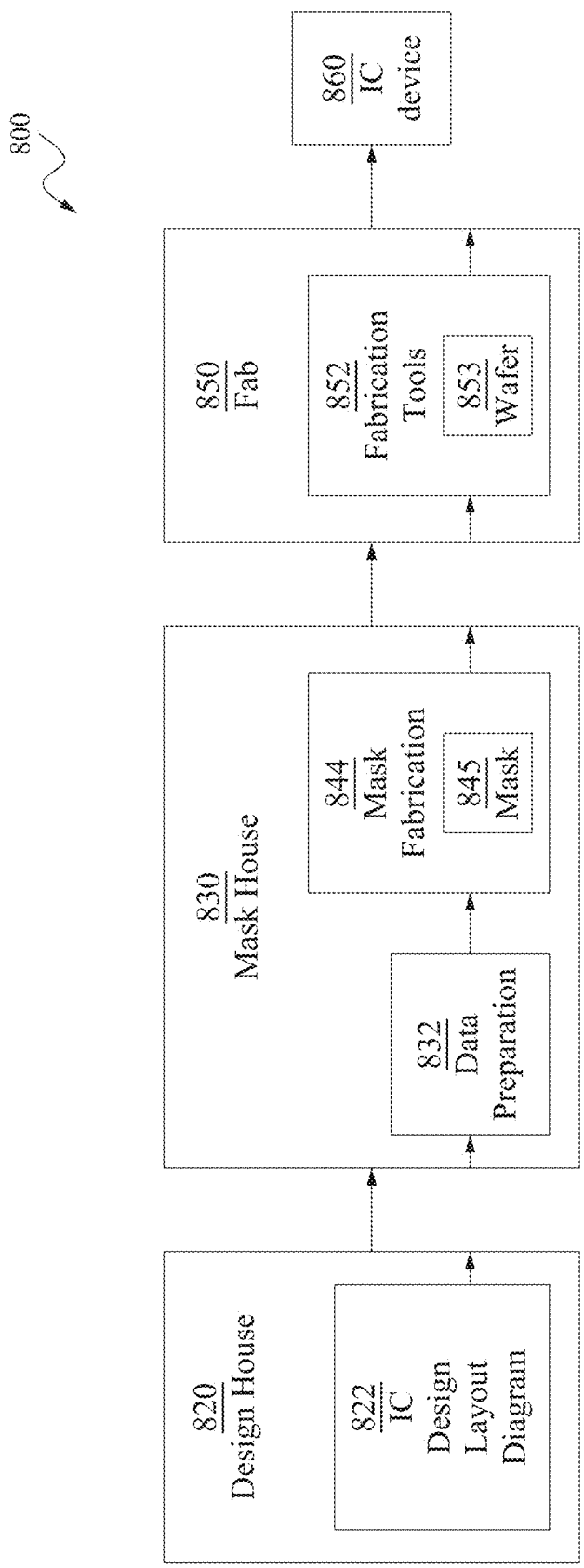
FIG. 8 is a block diagram of an IC device manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place-and-route operation. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (flimitRDF). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab

850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a substrate, and a first cell and a second cell over the substrate. The first cell is adjacent the second cell, and each of the first cell and the second cell comprises at least one active region and at least one gate region extending across the at least one active region. The first cell comprises a first input/output (TO) pattern along a first track among a plurality of tracks in a first metal layer, the plurality of tracks elongated along a first axis and spaced from each other along a second axis transverse to the first axis. The second cell comprises a plurality of conductive patterns along corresponding different tracks among the plurality of tracks in the first metal layer, each of the plurality of conductive patterns being an IO pattern of the second cell or a floating conductive pattern. The first metal layer further comprises a first connecting pattern along the first track and connects the first IO pattern of the first cell and a second IO pattern of the second cell. The second IO pattern is one of the plurality of conductive patterns of the second cell and is along the first track.

In some embodiments, a method comprises generating a layout diagram of an integrated circuit (IC) device, and manufacturing the IC device based on the generated layout diagram. The generating the layout diagram comprises placing a first cell adjacent a second cell in the layout diagram. The first cell comprises a first input/output (TO) pattern, the second cell comprises a second IO pattern corresponding to the first IO pattern, and the first IO pattern and the second IO pattern are in a first metal layer and aligned along a first axis. The generating the layout diagram further comprises routing, in the first metal layer, a connecting pattern between the first IO pattern and the second IO pattern. The connecting pattern is contiguous to, and aligned along the first axis with, both of the first IO pattern and the second IO pattern. The first metal layer is a metal-zero (M0) layer or a back-side-metal-zero (M0_B) layer.

In some embodiments, a method of manufacturing an integrated circuit (IC) device in accordance with a layout diagram comprises forming a plurality of transistors over a substrate, depositing a metal layer over the substrate, and patterning the metal layer to obtain a plurality of conductive patterns. The plurality of conductive patterns comprises a first set of conductive patterns over and electrically coupled to a corresponding first set of transistors among the plurality of transistors, the first set of transistors electrically coupled into a first circuit corresponding to a first cell in the layout diagram, and a second set of conductive patterns over and electrically coupled to a corresponding second set of transistors among the plurality of transistors, the second set of transistors electrically coupled into a second circuit corresponding to a second cell in the layout diagram. The first and second sets of conductive patterns comprise a common conductive pattern. The metal layer is a metal-zero (M0) layer or a back-side-metal-zero (M0_B) layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a substrate; and
a first cell and a second cell over the substrate, the first cell adjacent the second cell, each of the first cell and the second cell comprising at least one active region and at least one gate region extending across the at least one active region,
wherein
the first cell comprises a first input/output (TO) pattern along a first track among a plurality of tracks in a first metal layer, the plurality of tracks elongated along a first axis and spaced from each other along a second axis transverse to the first axis,
the second cell comprises a plurality of conductive patterns along corresponding different tracks among the plurality of tracks in the first metal layer, each of the plurality of conductive patterns being an IO pattern of the second cell or a floating conductive pattern, and
the first metal layer further comprises a first connecting pattern along the first track and connecting the first IO pattern of the first cell and a second IO pattern of the second cell, wherein the second IO pattern is one of the plurality of conductive patterns of the second cell and is along the first track.

2. The IC device of claim 1, wherein
the plurality of conductive patterns of the second cell comprises multiple IO patterns of the second cell electrically coupled with each other.

3. The IC device of claim 1, wherein
each of the first cell and the second cell further comprises conductive patterns in the first metal layer and a second metal layer,
one of the first metal layer and the second metal layer corresponds to a front side metal layer of the IC device, and the other of the first metal layer and the second metal layer corresponds to a back side metal layer of the IC device, and
the second cell has at least one further conductive pattern along at least one corresponding track in the second metal layer, the further conductive pattern being an IO pattern of the second cell or a floating conductive pattern.

4. The IC device of claim 1, wherein
the first cell further comprises a third IO pattern along a second track among the plurality of tracks,
the first IO pattern and the third IO pattern are configured to receive data which are swappable with each other without changing a function configured to be performed by the first cell, and
one of the plurality of conductive patterns of the second cell is along the second track.

5. The IC device of claim 1, wherein
the plurality of conductive patterns of the second cell further comprises
a third IO pattern of the second cell along a second track among the plurality of tracks, and
a first floating conductive pattern along a third track among the plurality of tracks, and
the IC device further comprises:
a second connecting pattern in a second metal layer, and
vias electrically coupling the second connecting pattern correspondingly to the second IO pattern and the third IO pattern.

6. The IC device of claim 1, wherein
the plurality of conductive patterns of the second cell further comprises
  a third IO pattern of the second cell along a second track among the plurality of tracks, and
  a first floating conductive pattern along a third track among the plurality of tracks,
the IC device further comprises:
  an extended contact structure over and in electrical contact with the at least one active region in the second cell, and
  vias electrically coupling the extended contact structure correspondingly to the second IO pattern and the third IO pattern, and
the extended contact structure overlaps, without being electrically coupled to, the first floating conductive pattern.

7. The IC device of claim 1, further comprising a second metal layer, wherein
one of the first metal layer and the second metal layer corresponds to a front side metal layer of the IC device, and the other of the first metal layer and the second metal layer corresponds to a back side metal layer of the IC device,
the second cell has a third IO pattern along a corresponding track in the second metal layer,
the IC device further comprises:
  an extended contact structure over and in electrical contact with the at least one active region in the second cell,
  vias electrically coupling the extended contact structure correspondingly to the second IO pattern in the first metal layer and the third IO pattern in the second metal layer, and
the extended contact structure overlaps, without being electrically coupled to, a floating conductive pattern among the plurality of conductive patterns of the second cell.

8. A method, comprising:
generating a layout diagram of an integrated circuit (IC) device; and
manufacturing the IC device based on the generated layout diagram,
wherein
said generating the layout diagram comprises:
  placing a first cell adjacent a second cell in the layout diagram, each of the first cell and the second cell comprising at least one active region and at least one gate region extending across the at least one active region, wherein the first cell comprises a first input/output (TO) pattern, the second cell comprises a second IO pattern corresponding to the first IO pattern, and the first IO pattern and the second IO pattern are in a first metal layer and aligned along a first axis; and
  routing, in the first metal layer, a connecting pattern between the first IO pattern and the second IO pattern, wherein the connecting pattern is contiguous to, and aligned along the first axis with, both of the first IO pattern and the second IO pattern, and
the first metal layer is a metal-zero (M0) layer or a back-side-metal-zero (M0_B) layer.

9. The method of claim 8, wherein
said placing comprises placing a first boundary of the first cell in abutment with a second boundary of the second cell.

10. The method of claim 8, wherein
said placing comprises placing a first boundary of the first cell at a space along the first axis from a second boundary of the second cell, and
the space is unfilled by a non-filler cell.

11. The method of claim 8, further comprising:
before said placing, selecting the second cell from a plurality of cells,
wherein
the plurality of cells has same circuitry, and corresponding IO patterns along corresponding different tracks among a plurality of tracks in the first metal layer,
the plurality of tracks is spaced from each other along a second axis transverse to the first axis,
the first IO pattern of the first cell is along a first track among the plurality of tracks, and
said selecting comprises selecting, from the plurality of cells, the second cell having the corresponding second IO pattern along the first track.

12. The method of claim 11, further comprising:
before said placing, transforming the second cell by performing at least one of
  flipping the second cell across the second axis, or
  switching positions of conductive patterns of the second cell in the first metal layer and conductive patterns of the second cell in a second metal layer with each other, one of the first metal layer and the second metal layer corresponding to a front side metal layer of the IC device, and the other of the first metal layer and the second metal layer corresponding to a back side metal layer of the IC device.

13. The method of claim 12, wherein
the first metal layer is the M0 layer, and the second metal layer is a metal-one (M1) layer, or
the first metal layer is the M0_B layer, and the second metal layer is a back-side-metal-one (M1_B) layer.

14. The method of claim 8, wherein
the second cell comprises a plurality of IO patterns electrically coupled with each other and arranged along corresponding different tracks among a plurality of tracks in the first metal layer,
the plurality of tracks is spaced from each other along a second axis transverse to the first axis,
the first IO pattern of the first cell is along a first track among the plurality of tracks, and
the second IO pattern being routed by the connecting pattern to the first IO pattern is one of the plurality of IO patterns and is along the first track.

15. The method of claim 14, wherein
said routing further comprises generating at least one of a via or a conductive pattern in a second metal layer to electrically couple the second IO pattern with a further IO pattern among the plurality of IO patterns.

16. The method of claim 11, wherein
the first cell further comprises a third IO pattern along a second track among the plurality of tracks,
the first IO pattern and the third IO pattern are configured to receive data which are swappable with each other without changing a function configured to be performed by the first cell, and
said selecting the second cell is performed in response to a determination that none of the plurality of cells has the corresponding IO pattern along the second track.

17. The method of claim 11, further comprising:
before said placing, flipping the second cell across the second axis, to rearrange the second IO pattern from a first side to a second side opposite the first side along the first axis, the second side facing the first cell along the first axis.

18. The method of claim 11, wherein
each of the first cell and the plurality of cells comprises conductive patterns in the first metal layer and a second metal layer,
one of the first metal layer and the second metal layer corresponds to a front side metal layer of the IC device, and the other of the first metal layer and the second metal layer corresponds to a back side metal layer of the IC device, and
the second cell selected from the plurality of cells has the corresponding IO pattern along a track in the second metal layer.

19. The method of claim 18, further comprising:
before said placing, switching positions of conductive patterns of the second cell in the first metal layer and conductive patterns of the second cell in the second metal layer with each other.

20. A method, comprising:
generating a layout diagram of an integrated circuit (IC) device; and
manufacturing the IC device based on the generated layout diagram, wherein
said generating the layout diagram comprises:
  placing a first cell adjacent a second cell in the layout diagram, each of the first cell and the second cell comprising at least one active region and at least one gate region extending across the at least one active region, wherein the first cell comprises a first input/output (TO) pattern, the second cell comprises a second IO pattern corresponding to the first IO pattern, and the first IO pattern and the second IO pattern are in a first metal layer and aligned along a first axis; and
  routing, in the first metal layer, a connecting pattern between the first IO pattern and the second IO pattern, wherein the connecting pattern is contiguous to, and aligned along the first axis with, both of the first IO pattern and the second IO pattern, and
said generating the layout diagram further comprises, before said placing, transforming the second cell by performing at least one of:
  flipping the second cell across a second axis transverse to the first axis, or
  switching positions of conductive patterns of the second cell in the first metal layer and conductive patterns of the second cell in a second metal layer with each other, one of the first metal layer and the second metal layer corresponding to a front side metal layer of the IC device, and the other of the first metal layer and the second metal layer corresponding to a back side metal layer of the IC device.

* * * * *